(12) United States Patent
Liu et al.

(10) Patent No.: US 11,177,165 B2
(45) Date of Patent: Nov. 16, 2021

(54) METHOD OF MANUFACTURING A SEMICONDUCTOR DEVICE HAVING REDISTRIBUTION LAYER INCLUDING A DIELECTRIC LAYER MADE FROM A LOW-TEMPERATURE CURE POLYIMIDE

(71) Applicant: Taiwan Semiconductor Manufacturing Company, Ltd., Hsinchu (TW)

(72) Inventors: Zi-Jheng Liu, Taoyuan (TW); Yu-Hsiang Hu, Hsinchu (TW); Hung-Jui Kuo, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1 day.

(21) Appl. No.: 16/148,653

(22) Filed: Oct. 1, 2018

(65) Prior Publication Data

US 2019/0035680 A1 Jan. 31, 2019

Related U.S. Application Data

(62) Division of application No. 15/074,742, filed on Mar. 18, 2016, now Pat. No. 10,090,194.

(51) Int. Cl.
| | |
|---|---|
| *H01L 21/768* | (2006.01) |
| *H01L 21/56* | (2006.01) |
| *H01L 23/498* | (2006.01) |
| *H01L 23/525* | (2006.01) |
| *H01L 23/532* | (2006.01) |

(Continued)

(52) U.S. Cl.
CPC .. *H01L 21/76825* (2013.01); *H01L 21/76802* (2013.01); *H01L 21/76829* (2013.01); *H01L 21/76877* (2013.01); *H01L 23/49822* (2013.01); *H01L 23/49827* (2013.01); *H01L 23/525* (2013.01); *H01L 23/5329* (2013.01); *H01L 23/5389* (2013.01); *H01L 21/561* (2013.01); *H01L 21/568* (2013.01); *H01L 21/76804* (2013.01); *H01L 23/3128* (2013.01); *H01L 2224/04105* (2013.01); *H01L 2224/12105* (2013.01); *H01L 2224/18* (2013.01); *H01L 2224/73267* (2013.01); *H01L 2224/97* (2013.01)

(58) Field of Classification Search
None
See application file for complete search history.

(56) References Cited

U.S. PATENT DOCUMENTS

| | | | |
|---|---|---|---|
| 4,803,147 A | | 2/1989 | Mueller et al. |
| 5,348,835 A | * | 9/1994 | Oba et al. |

(Continued)

FOREIGN PATENT DOCUMENTS

| | | |
|---|---|---|
| GN | 1449016 A | 10/2003 |
| TW | 200736833 A | 10/2007 |

(Continued)

*Primary Examiner* — Erik Kielin
(74) *Attorney, Agent, or Firm* — Slater Matsil, LLP

(57) ABSTRACT

A method of manufacturing a semiconductor device includes the step of positioning a patterned mask over a dielectric layer. The dielectric layer comprises a low-temperature cure polyimide. The method further includes the steps of exposing a first surface of the dielectric layer through the patterned mask to an I-line wavelength within an I-line stepper, and developing the dielectric layer to form an opening.

20 Claims, 16 Drawing Sheets

(51) Int. Cl.
*H01L 23/538* (2006.01)
*H01L 23/31* (2006.01)

(56) References Cited

U.S. PATENT DOCUMENTS

| | | |
|---|---|---|
| 6,597,027 B1 | 7/2003 | Hashimoto et al. |
| 2004/0038520 A1 | 2/2004 | Seto et al. |
| 2004/0166311 A1* | 8/2004 | Yang et al. |
| 2005/0032323 A1 | 2/2005 | Chen et al. |
| 2011/0212402 A1 | 9/2011 | Chou et al. |
| 2011/0274853 A1 | 11/2011 | Park et al. |
| 2012/0187584 A1* | 7/2012 | Lin ............... H01L 21/56 257/790 |
| 2014/0367160 A1* | 12/2014 | Yu ............... H01L 23/5383 174/377 |
| 2015/0219990 A1 | 8/2015 | Malik et al. |
| 2016/0218082 A1* | 7/2016 | Lee ............... H01L 24/19 |
| 2017/0101521 A1* | 4/2017 | Koyama ........ H01L 21/76834 |
| 2020/0248015 A1* | 8/2020 | Hedge .............. C08G 73/127 |

FOREIGN PATENT DOCUMENTS

| | | |
|---|---|---|
| TW | 201131290 A | 9/2011 |
| TW | 201538574 A | 10/2015 |

\* cited by examiner

METHOD OF MANUFACTURING A SEMICONDUCTOR DEVICE HAVING REDISTRIBUTION LAYER INCLUDING A DIELECTRIC LAYER MADE FROM A LOW-TEMPERATURE CURE POLYIMIDE

PRIORITY CLAIM AND CROSS-REFERENCE

This application claims priority to and is a divisional of U.S. patent application Ser. No. 15/074,742 entitled "Semiconductor Device and Method" and filed on Mar. 18, 2016, which application is incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
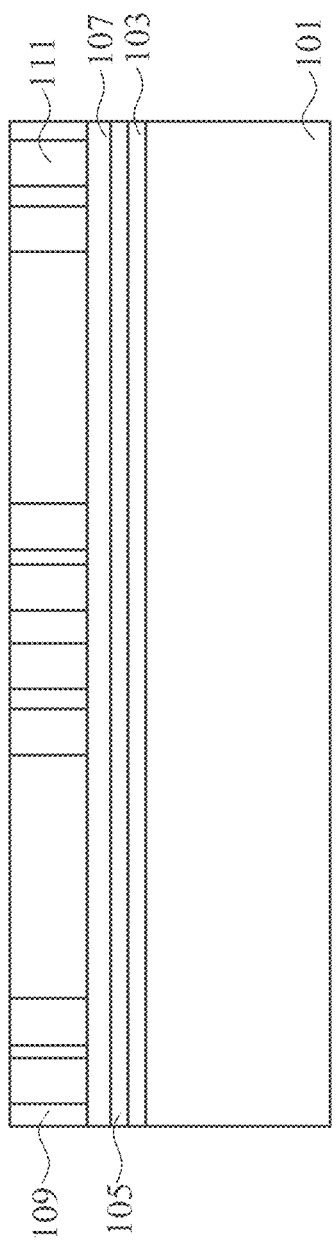
FIG. 1 illustrates a formation of vias in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1, there is shown a first carrier substrate 101 with an adhesive layer 103, a polymer layer 105, and a first seed layer 107 over the first carrier substrate 101. The first carrier substrate 101 comprises, for example, silicon based materials, such as glass or silicon oxide, or other materials, such as aluminum oxide, combinations of any of these materials, or the like. The first carrier substrate 101 is planar in order to accommodate an attachment of semiconductor devices such as a first semiconductor device 201 and a second semiconductor device 301 (not illustrated in FIG. 1 but illustrated and discussed below with respect to FIGS. 2-3).

The adhesive layer 103 is placed on the first carrier substrate 101 in order to assist in the adherence of overlying structures (e.g., the polymer layer 105). In an embodiment the adhesive layer 103 may comprise an ultra-violet glue, which loses its adhesive properties when exposed to ultra-violet light. However, other types of adhesives, such as pressure sensitive adhesives, radiation curable adhesives, epoxies, combinations of these, or the like, may also be used. The adhesive layer 103 may be placed onto the first carrier substrate 101 in a semi-liquid or gel form, which is readily deformable under pressure.

The polymer layer 105 is placed over the adhesive layer 103 and is utilized in order to provide protection to, e.g., the first semiconductor device 201 and the second semiconductor device 301 once the first semiconductor device 201 and the second semiconductor device 301 have been attached. In an embodiment the polymer layer 105 may be a positive tone material such as polybenzoxazole (PBO, such as the material HD8820), although any suitable material, such as polyimide or a polyimide derivative, may also be utilized. The polymer layer 105 may be placed using, e.g., a spin-coating process to a thickness of between about 0.5 µm and about 10 µm, such as about 5 µm, although any suitable method and thickness may be used.

The first seed layer 107 is formed over the polymer layer 105. In an embodiment the first seed layer 107 is a thin layer of a conductive material that aids in the formation of a thicker layer during subsequent processing steps. The first seed layer 107 may comprise a layer of titanium about 1,000 Å thick followed by a layer of copper about 5,000 Å thick. The first seed layer 107 may be created using processes such as sputtering, evaporation, or PECVD processes, depending upon the desired materials. The first seed layer 107 may be formed to have a thickness of between about 0.3 µm and about 1 µm, such as about 0.5 µm.

FIG. 1 also illustrates a placement and patterning of a photoresist 109 over the first seed layer 107. In an embodiment the photoresist 109 may be placed on the first seed layer 107 using, e.g., a spin coating technique to a height of between about 50 µm and about 250 µm, such as about 120 µm. Once in place, the photoresist 109 may then be patterned by exposing the photoresist 109 to a patterned energy source (e.g., a patterned light source) so as to induce a chemical reaction, thereby inducing a physical change in those portions of the photoresist 109 exposed to the patterned light source. A developer is then applied to the exposed photoresist 109 to take advantage of the physical changes and selectively remove either the exposed portion of the photoresist 109 or the unexposed portion of the photoresist 109, depending upon the desired pattern.

In an embodiment the pattern formed into the photoresist 109 is a pattern for vias 111. The vias 111 are formed in such a placement as to be located on different sides of subsequently attached devices such as the first semiconductor device 201 and the second semiconductor device 301. However, any suitable arrangement for the pattern of vias 111, such as by being located such that the first semiconductor device 201 and the second semiconductor device are placed on opposing sides of the vias 111, may be utilized.

In an embodiment the vias 111 are formed within the photoresist 109. In an embodiment the vias 111 comprise one or more conductive materials, such as copper, tungsten, other conductive metals, or the like, and may be formed, for example, by electroplating, electroless plating, or the like. In an embodiment, an electroplating process is used wherein the first seed layer 107 and the photoresist 109 are submerged or immersed in an electroplating solution. The first seed layer 107 surface is electrically connected to the negative side of an external DC power supply such that the first seed layer 107 functions as the cathode in the electroplating process. A solid conductive anode, such as a copper anode, is also immersed in the solution and is attached to the positive side of the power supply. The atoms from the anode are dissolved into the solution, from which the cathode, e.g., the first seed layer 107, acquires the dissolved atoms, thereby plating the exposed conductive areas of the first seed layer 107 within the opening of the photoresist 109.

Once the vias 111 have been formed using the photoresist 109 and the first seed layer 107, the photoresist 109 may be removed using a suitable removal process (not illustrated in FIG. 1 but seen in FIG. 3 below). In an embodiment, a plasma ashing process may be used to remove the photoresist 109, whereby the temperature of the photoresist 109 may be increased until the photoresist 109 experiences a thermal decomposition and may be removed. However, any other suitable process, such as a wet strip, may alternatively be utilized. The removal of the photoresist 109 may expose the underlying portions of the first seed layer 107.

Once exposed a removal of the exposed portions of the first seed layer 107 may be performed (not illustrated in FIG. 1 but seen in FIG. 3 below). In an embodiment the exposed portions of the first seed layer 107 (e.g., those portions that are not covered by the vias 111) may be removed by, for example, a wet or dry etching process. For example, in a dry etching process reactants may be directed towards the first seed layer 107 using the vias 111 as masks. In another embodiment, etchants may be sprayed or otherwise put into contact with the first seed layer 107 in order to remove the exposed portions of the first seed layer 107. After the exposed portion of the first seed layer 107 has been etched away, a portion of the polymer layer 105 is exposed between the vias 111.

Figure 2:
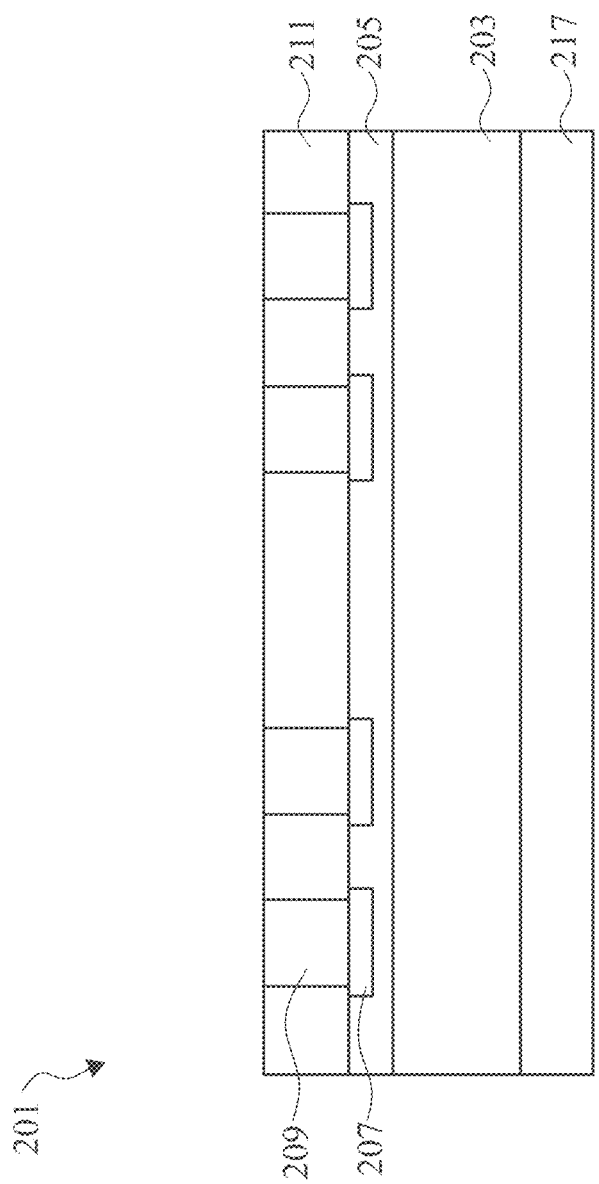
FIG. 2 illustrates a first semiconductor device in accordance with some embodiments.

FIG. 2 illustrates a first semiconductor device 201 that will be attached to the polymer layer 105 within the vias 111 (not illustrated in FIG. 2 but illustrated and described below with respect to FIG. 3). In an embodiment the first semiconductor device 201 comprises a first substrate 203, first active devices (not individually illustrated), first metallization layers 205, first contact pads 207, a first passivation layer 211, and first external connectors 209. The first substrate 203 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first active devices comprise a wide variety of active devices and passive devices such as capacitors, resistors, inductors and the like that may be used to generate the desired structural and functional requirements of the design for the first semiconductor device 201. The first active devices may be formed using any suitable methods either within or else on the first substrate 203.

The first metallization layers 205 are formed over the first substrate 203 and the first active devices and are designed to connect the various active devices to form functional circuitry. In an embodiment the first metallization layers 205 are formed of alternating layers of dielectric and conductive material and may be formed through any suitable process (such as deposition, damascene, dual damascene, etc.). In an embodiment there may be four layers of metallization separated from the first substrate 203 by at least one interlayer dielectric layer (ILD), but the precise number of first metallization layers 205 is dependent upon the design of the first semiconductor device 201.

The first contact pads 207 may be formed over and in electrical contact with the first metallization layers 205. The first contact pads 207 may comprise aluminum, but other materials, such as copper, may alternatively be used. The first contact pads 207 may be formed using a deposition process, such as sputtering, to form a layer of material (not shown) and portions of the layer of material may then be removed through a suitable process (such as photolithographic masking and etching) to form the first contact pads 207. However, any other suitable process may be utilized to form the first contact pads 207. The first contact pads may be formed to have a thickness of between about 0.5 µm and about 4 µm, such as about 1.45 µm.

The first passivation layer 211 may be formed on the first substrate 203 over the first metallization layers 205 and the first contact pads 207. The first passivation layer 211 may be made of one or more suitable dielectric materials such as polybenzoxazole (PBO), although any suitable material, such as polyimide or a polyimide derivative, may alternatively be utilized. The first passivation layer 211 may be placed using, e.g., a spin-coating process to a thickness of between about 5 µm and about 25 µm, such as about 7 µm, although any suitable method and thickness may alternatively be used The first external connectors 209 may be formed to provide conductive regions for contact between the first contact pads 207 and, e.g., a first redistribution layer 505 (not illustrated in FIG. 2 but illustrated and described below with respect to FIG. 5B). In an embodiment the first external connectors 209 may be conductive pillars and may be formed by initially forming a photoresist (not shown) over the first passivation layer 211 to a thickness between about 5 µm to about 20 µm, such as about 10 µm. The photoresist may be patterned to expose portions of the first passivation layers 211 through which the conductive pillars will extend. Once patterned, the photoresist may then be used as a mask to remove the desired portions of the first passivation layer 211, thereby exposing those portions of the underlying first contact pads 207 to which the first external connectors 209 will make contact.

The first external connectors 209 may be formed within the openings of both the first passivation layer 211 and the photoresist. The first external connectors 209 may be formed from a conductive material such as copper, although other conductive materials such as nickel, gold, or metal alloy, combinations of these, or the like may also be used. Additionally, the first external connectors 209 may be formed using a process such as electroplating, by which an electric current is run through the conductive portions of the first contact pads 207 to which the first external connectors 209 are desired to be formed, and the first contact pads 207 are immersed in a solution. The solution and the electric current deposit, e.g., copper, within the openings in order to fill and/or overfill the openings of the photoresist and the first passivation layer 211, thereby forming the first external connectors 209. Excess conductive material and photoresist outside of the openings of the first passivation layer 211 may then be removed using, for example, an ashing process, a chemical mechanical polish (CMP) process, combinations of these, or the like.

However, as one of ordinary skill in the art will recognize, the above described process to form the first external connectors 209 is merely one such description, and is not meant to limit the embodiments to this exact process. Rather, the described process is intended to be merely illustrative, as any suitable process for forming the first external connectors 209 may alternatively be utilized. All suitable processes are fully intended to be included within the scope of the present embodiments.

A die attach film (DAF) 217 may be placed on an opposite side of the first substrate 203 in order to assist in the attachment of the first semiconductor device 201 to the polymer layer 105. In an embodiment the die attach film 217 is an epoxy resin, a phenol resin, acrylic rubber, silica filler, or a combination thereof, and is applied using a lamination technique. However, any other suitable alternative material and method of formation may alternatively be utilized.

Figure 3:
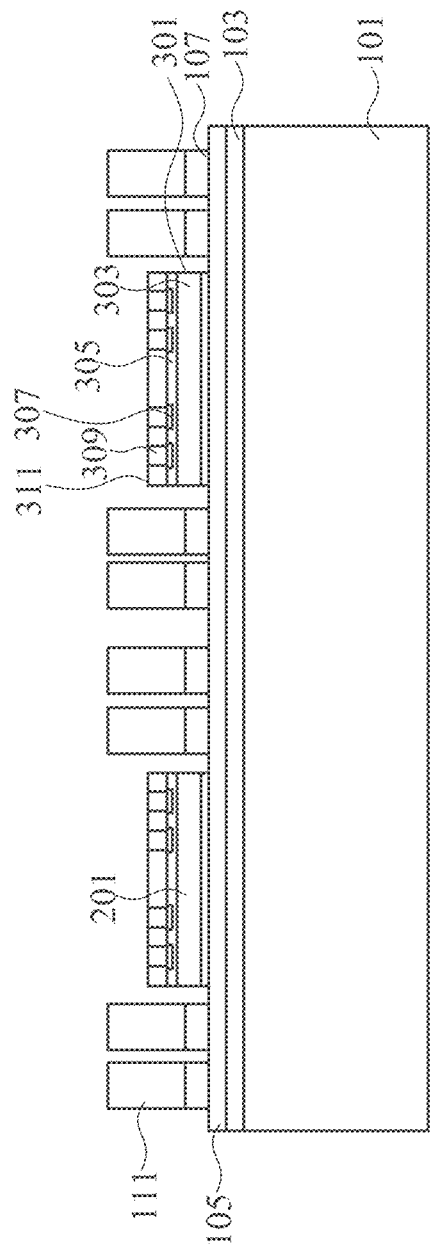
FIG. 3 illustrates a placement of the first semiconductor device and a second semiconductor device in accordance with some embodiments.

FIG. 3 illustrates a placement of the first semiconductor device 201 onto the polymer layer 105 along with a placement of the second semiconductor device 301. In an embodiment the second semiconductor device 301 may comprise a second substrate 303, second active devices (not individually illustrated), second metallization layers 305, second contact pads 307, a second passivation layer 311, and second external connectors 309. In an embodiment the second substrate 303, the second active devices, the second metallization layers 305, the second contact pads 307, the second passivation layer 311, and the second external connectors 309 may be similar to the first substrate 203, the first active devices, the first metallization layers 205, the first contact pads 207, the first passivation layer 211, and the first external connectors 209, although they may also be different.

In an embodiment the first semiconductor device 201 and the second semiconductor device 301 may be placed onto the polymer layer 105 using, e.g., a pick and place process. However, any other method of placing the first semiconductor device 201 and the second semiconductor device 301 may also be utilized.

Figure 4:
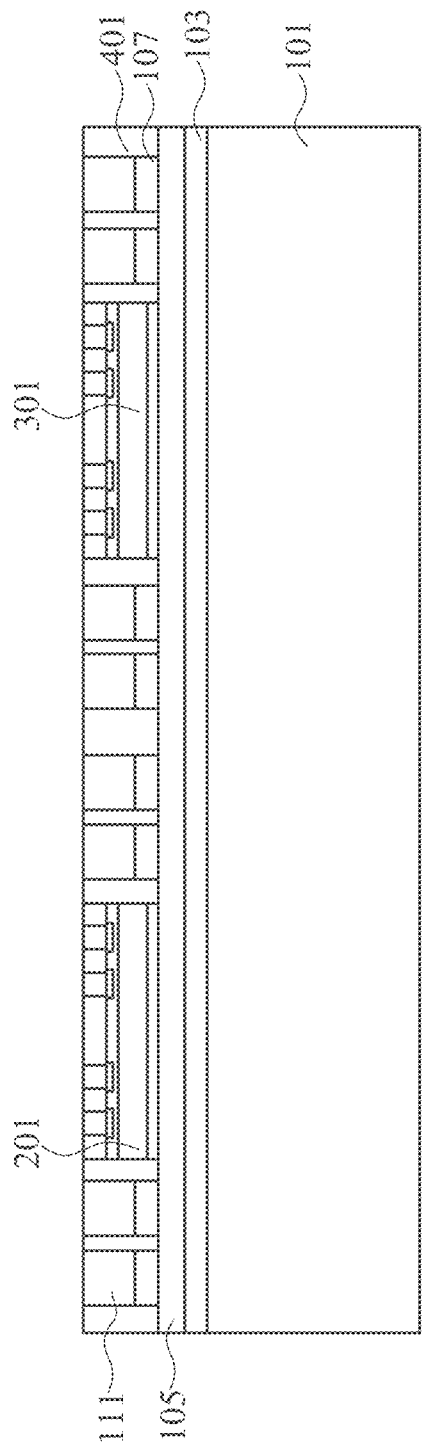
FIG. 4 illustrates an encapsulation of the vias, the first semiconductor device, and the second semiconductor device in accordance with some embodiments.

FIG. 4 illustrates an encapsulation of the vias 111, the first semiconductor device 201 and the second semiconductor device 301. The encapsulation may be performed in a molding device (not illustrated in FIG. 4), which may comprise a top molding portion and a bottom molding portion separable from the top molding portion. When the top molding portion is lowered to be adjacent to the bottom molding portion, a molding cavity may be formed for the first carrier substrate 101, the vias 111, the first semiconductor device 201, and the second semiconductor device 301.

During the encapsulation process the top molding portion may be placed adjacent to the bottom molding portion, thereby enclosing the first carrier substrate 101, the vias 111, the first semiconductor device 201, and the second semiconductor device 301 within the molding cavity. Once enclosed, the top molding portion and the bottom molding portion may form an airtight seal in order to control the influx and outflux of gasses from the molding cavity. Once sealed, an encapsulant 401 may be placed within the molding cavity. The encapsulant 401 may be a molding compound resin such as polyimide, PPS, PEEK, PES, a heat resistant crystal resin, combinations of these, or the like. The encapsulant 401 may be placed within the molding cavity prior to the alignment of the top molding portion and the bottom molding portion, or else may be injected into the molding cavity through an injection port.

Once the encapsulant 401 has been placed into the molding cavity such that the encapsulant 401 encapsulates the first carrier substrate 101, the vias 111, the first semiconductor device 201, and the second semiconductor device 301, the encapsulant 401 may be cured in order to harden the encapsulant 401 for optimum protection. While the exact curing process is dependent at least in part on the particular material chosen for the encapsulant 401, in an embodiment in which molding compound is chosen as the encapsulant 401, the curing could occur through a process such as heating the encapsulant 401 to between about 100° C. and about 130° C., such as about 125° C. for about 60 sec to about 3000 sec, such as about 600 sec. Additionally, initiators and/or catalysts may be included within the encapsulant 401 to better control the curing process.

However, as one having ordinary skill in the art will recognize, the curing process described above is merely an exemplary process and is not meant to limit the current embodiments. Other curing processes, such as irradiation or even allowing the encapsulant 401 to harden at ambient temperature, may alternatively be used. Any suitable curing process may be used, and all such processes are fully intended to be included within the scope of the embodiments discussed herein.

FIG. 4 also illustrates a thinning of the encapsulant 401 in order to expose the vias 111, the first semiconductor device 201, and the second semiconductor device 301 for further processing. The thinning may be performed, e.g., using a mechanical grinding or chemical mechanical polishing (CMP) process whereby chemical etchants and abrasives are utilized to react and grind away the encapsulant 401, the first semiconductor device 201 and the second semiconductor device 301 until the vias 111, the first external connectors 209 (illustrated in FIG. 2), and the second external connectors 309 (illustrated in FIG. 3) have been exposed. As such, the first semiconductor device 201, the second semiconductor device 301, and the vias 111 may have a planar surface that is also planar with the encapsulant 401.

However, while the CMP process described above is presented as one illustrative embodiment, it is not intended to be limiting to the embodiments. Any other suitable removal process may alternatively be used to thin the encapsulant 401, the first semiconductor device 201, and the second semiconductor device 301 and expose the vias 111. For example, a series of chemical etches may be utilized. This process and any other suitable process may alternatively be utilized to thin the encapsulant 401, the first semiconductor device 201, and the second semiconductor device 301, and all such processes are fully intended to be included within the scope of the embodiments.

Figure 5A:
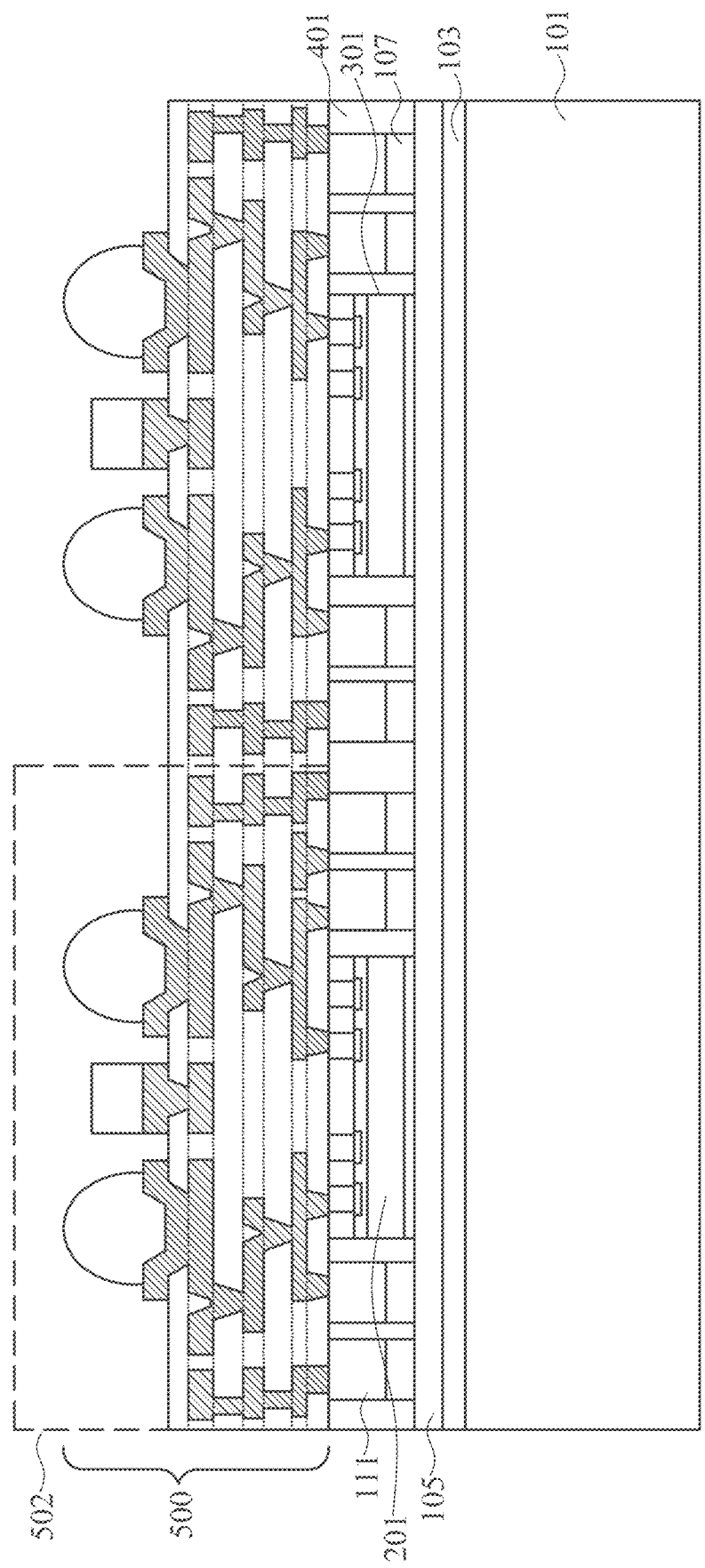
FIGS. 5A-5B illustrate a formation of a redistribution structure in accordance with some embodiments.
Figure 5B:
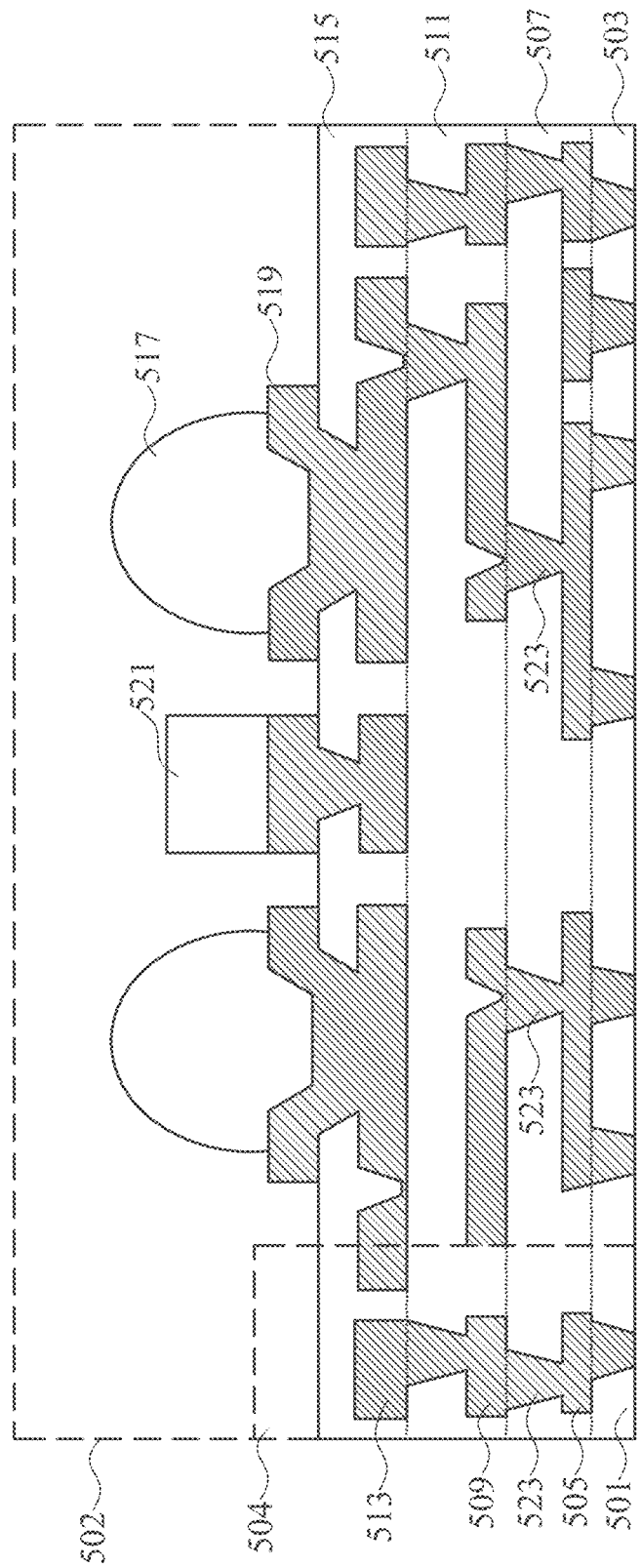

FIGS. 5A-5B illustrate a formation of a redistribution structure 500 over the encapsulant 401 and the now exposed first semiconductor device 201, second semiconductor device, and vias 111, with FIG. 5B illustrating a close up view of the dashed box 502 in FIG. 5A. In an embodiment the redistribution structure 500 may be formed by initially forming a first redistribution passivation layer 501 over the encapsulant 401. The first redistribution passivation layer 501 may be a polybenzoxazole (PBO). In an alternative embodiment the first redistribution passivation layer 501 may be polyimide, such as a low-cure temperature polyimide. The first redistribution passivation layer 501 may be placed using, e.g., a spin-coating process to a thickness of between about 5 μm and about 17 μm, such as about 7 μm, although any suitable method and thickness may alternatively be used.

Once the first redistribution passivation layer 501 has been formed, first redistribution vias 503 may be formed through the first redistribution passivation layer 501 in order to make electrical connections to the first semiconductor device 201, the second semiconductor device 301, and the vias 111. In an embodiment the first redistribution vias 503 may be formed by using, e.g., damascene process whereby the first redistribution passivation layer 501 is initially patterned to form openings using, e.g., a photolithographic masking and etching process or, if the material of the first redistribution passivation layer 501 is photosensitive, exposing and developing the material of the first redistribution passivation layer 501. Once patterned, the openings are filled with a conductive material such as copper and any excess material is removed using, e.g., a planarization process such as chemical mechanical polishing. However, any suitable process or materials may be utilized.

After the first redistribution vias 503 have been formed, a first redistribution layer 505 is formed over an in electrical connection with the first redistribution vias 503. In an embodiment the first redistribution layer 505 may be formed by initially forming a seed layer (not shown) of a titanium copper alloy through a suitable formation process such as CVD or sputtering. A photoresist may then be formed to cover the seed layer, and the photoresist may then be patterned to expose those portions of the seed layer that are located where the first redistribution layer 505 is desired to be located.

Once the photoresist has been formed and patterned, a conductive material, such as copper, may be formed on the seed layer through a deposition process such as plating. The conductive material may be formed to have a thickness of between about 1 μm and about 10 μm, such as about 5 μm. However, while the material and methods discussed are suitable to form the conductive material, these materials are merely exemplary. Any other suitable materials, such as AlCu or Au, and any other suitable processes of formation, such as CVD or PVD, may alternatively be used to form the first redistribution layer 505.

Once the conductive material has been formed, the photoresist may be removed through a suitable removal process such as chemical stripping and/or ashing. Additionally, after the removal of the photoresist, those portions of the seed layer that were covered by the photoresist may be removed through, for example, a suitable etch process using the conductive material as a mask.

After the first redistribution layer 505 has been formed, a second redistribution passivation layer 507 may be formed to help isolate the first redistribution layer 505. In an embodiment the second redistribution passivation layer 507 may be a different material than the first redistribution passivation layer 501. In an illustrative example, the first redistribution passivation layer 501 may be a PBO and the second distribution passivation layer may be a dielectric material with a higher adhesion to the underlying layers (e.g., the first redistribution layer 505 and the first redistribution passivation layer 501) such as a low-temperature cured polyimide. The low-temperature cured polyimide may be a negative tone material with a lower under-developing risk than the positive tone PBO used for the first redistribution passivation layer 501. In alternative embodiments the second redistribution passivation layer 507 is the same material as the first redistribution passivation layer 501. In this embodiment both the first and second redistribution passivation layers 501, 507 may be formed of a low-temperature cure polyimide.

An illustrative process for forming and patterning a low-temperature cure polyimide, such as when one or more of the redistribution passivation layers, such as the second redistribution passivation layer 507, are formed of a low-temperature cure polyimide, will be discussed in more detail. In one particular embodiment in which the low-temperature cured polyimide is used for the composition, the low-temperature cured polyimide may be formed by initially generating a low-temperature cured polyimide composition, which may comprise a low-temperature cured polyimide resin along with a photoactive components (PACs) placed into a low-temperature cured polyimide solvent. In an embodiment the low-temperature cured polyimide resin may comprise a polymer that is made up of monomers of the following formula:

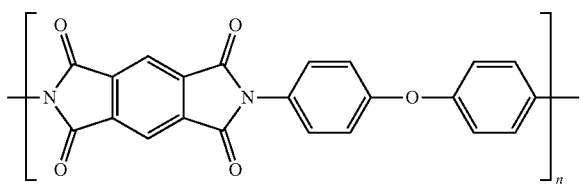

Additionally, while the low-temperature cured polyimide resin may be one of the embodiments as described above, the low-temperature cured polyimide resin is not intended to be limited to only the specific examples described herein. Rather, any suitable low-temperature cured polyimide resin may alternatively be utilized, and all such photosensitive polyimide resins are fully intended to be included within the scope of the embodiments.

The PACs may be photoactive components such as photoacid generators, photobase generators, free-radical generators, or the like, and the PACs may be positive-acting or negative-acting. In an embodiment in which the PACs are a photoacid generator, the PACs may comprise halogenated triazines, onium salts, diazonium salts, aromatic diazonium salts, phosphonium salts, sulfonium salts, iodonium salts, imide sulfonate, oxime sulfonate, disulfone, o-nitrobenzylsulfonate, sulfonated esters, halogenerated sulfonyloxy dicarboximides, diazodisulfones, α-cyanooxyaminesulfonates, imidesulfonates, ketodiazosulfones, sulfonyldiazoesters, 1,2-di(arylsulfonyl)hydrazines, nitrobenzyl esters, and the s-triazine derivatives, suitable combinations of these, and the like.

Specific examples of photoacid generators that may be used include α.-(trifluoromethylsulfonyloxy)-bicyclo[2.2.1]hept-5-ene-2,3-dicarbo-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl) sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl) triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, and the like.

In an embodiment in which the PACs are a free-radical generator, the PACs may comprise n-phenylglycine, aromatic ketones such as benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis(dimethylamino)benzo-phenone, p,p'-bis(diethylamino)-benzophenone, anthraquinone, 2-ethylanthraquinone, naphthaquinone and phenanthraquinone, benzoins such as benzoin, benzoinmethylether, benzoinethylether, benzoinisopropylether, benzoin-n-butylether, benzoin-phenyleether, methylbenzoin and ethybenzoin, benzyl derivatives such as dibenzyl, benzyldiphenyldisulfide and benzyldimethylketal, acridine derivatives such as 9-phenylacridine and 1,7-bis(9-acridinyl)heptane, thioxanthones such as 2-chlorothioxanthone, 2-methylthioxanthone, 2,4-diethylthioxanthone, 2,4-dimethylthioxanthone and 2-isopropylthioxanthone, acetophenones such as 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone, 2,4,5-triarylimidazole dimers such as 2-(o-chlorophenyl)-4,5-diphenylimidazole dimer, 2-(o-chlorophenyl)-4,5-di-(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmerc aptophenyl)-4,5-diphenylimidazole dimmer, suitable combinations of these, or the like.

In an embodiment in which the PACs are a photobase generator, the PACs may comprise quaternary ammonium dithiocarbamates, α aminoketones, oxime-urethane containing molecules such as dibenzophenoneoxime hexamethylene diurethan, ammonium tetraorganylborate salts, and N-(2-nitrobenzyloxycarbonyl) cyclic amines, suitable combinations of these, or the like. However, as one of ordinary skill in the art will recognize, the chemical compounds listed herein are merely intended as illustrated examples of the PACs and are not intended to limit the embodiments to only those PACs specifically described. Rather, any suitable PAC may alternatively be utilized, and all such PACs are fully intended to be included within the scope of the present embodiments.

In an embodiment the low-temperature cured polyimide solvent may be an organic solvent, and may comprise any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the low-temperature cured polyimide solvent for the low-temperature cured polyimide composition include acetone, methanol, ethanol, toluene, xylene, 4-hydroxy-4-methyl-2-pentatone, tetrahydrofuran, methyl ethyl ketone, cyclohexanone, methyl isoamyl ketone, 2-heptanone, ethylene glycol, ethylene glycol monoacetate, ethylene glycol dimethyl ether, ethylene glycol methylethyl ether, ethylene glycol monoethyl ether, methyl celluslve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, diethylene glycol monoethyl ether, diethylene glycol monobutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, ethyl acetate, butyl acetate, methyl lactate and ethyl lactate, propylene glycol, propylene glycol monoacetate, propylene glycol monoethyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, propylene glycol methyl ether adcetate, proplylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, propyl lactate, and butyl lactate, ethyl 3-ethoxypropionate, methyl 3-methoxypropionate, methyl 3-ethoxypropionate, and ethyl 3-methoxypropionate, β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, pylene carbonate, vinylene carbonate, ethylene carbonate, and butylene carbonate, acetate-2-methoxyethyl, acetate-2-ethoxyethyl, acetate-2-(2-ethoxyethoxy)ethyl, acetate-3-methoxy-3-methylbutyl, acetate-1-methoxy-2-propyl, dipropylene glycol, monomethylether, monoethylether, monopropylether, monobutylehter, monophenylether, dipropylene glycol monoacetate, dioxane, etheyl lactate, methyl acetate, ethyl acetate, butyl acetate, methyl puruvate, ethyl puruvate, propyl pyruvate, methyl methoxypropionate, ethyl ethoxypropionate, n-methylpyrrolidone (NMP), 2-methoxyethyl ether (diglyme), ethylene glycol monom-ethyl ether, propylene glycol monomethyl ether; methyl proponiate, ethyl proponiate and ethyl ethoxy proponiate, methylethyl ketone, cyclohexanone, 2-heptanone, carbon dioxide, cyclopentatone, cyclohexanone, ethyl 3-ethocypropionate, propylene glycol methyl ether acetate (PGMEA), methylene cellosolve, butyle acetate, and 2-ethoxyethanol, N-methylformamide, N,N-dimethylformamide, N-methylformanilide, N-methylacetamide, N,N-dimethylacetamide, N-methylpyrrolidone, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, polyamic acid ester, or the like.

In a non-limiting, illustrative embodiment the low-temperature cured polyimide composition may include N-methyl-2-pyrrolidone (NMP), polyamic acid ester, ethyl lactate (EL), tetraethylene glycol dimathacrylate or combinations thereof. For example, the low-temperature cured polyimide composition my comprise 45-55% N-methyl-2-pyrrolidone (NMP), 25-35% polyamic acid ester, 10-15% ethyl lactate (EL), and 1-5% tetraethylene glycol dimathacrylate.

In an embodiment the low-temperature cured polyimide resin and the PACs, along with any desired additives or other agents, are added to the low-temperature cured polyimide solvent for application. For example, the low-temperature cured polyimide resin may have a concentration of between about 5% and about 50%, such as about 25%, while the PACs may have a concentration of between about 0.1% and about 20%, such as about 5%. Once added, the mixture is then mixed in order to achieve an even composition throughout the low-temperature cured polyimide composition in order to ensure that there are no defects caused by an uneven mixing or non-constant composition. Once mixed together, the low-temperature cured polyimide composition may either be stored prior to its usage or else used immediately.

Using the second redistribution passivation layer 507 as an example, once ready, the second redistribution passivation layer 507 may be formed by initially applying the low-temperature cured polyimide composition onto the first redistribution layer 505 and the first redistribution passivation layer 501. The second redistribution passivation layer 507 may be applied to the first redistribution layer 505 so that the second redistribution passivation layer 507 coats an upper exposed surface of the first redistribution layer 505, and may be applied using a process such as a spin-on coating process, a dip coating method, an air-knife coating method, a curtain coating method, a wire-bar coating method, a gravure coating method, a lamination method, an extrusion coating method, combinations of these, or the like. The second redistribution passivation layer 507 may be placed to a thickness of between about 7 μm to about 35 μm.

Once applied, the second redistribution passivation layer 507 may be baked in order to cure and dry the second redistribution passivation layer 507 prior to exposure (described further below). The curing and drying of the second redistribution passivation layer 507 removes the solvent components while leaving behind the resin, the PACs, and any other chosen additives. In an embodiment the pre-bake may be performed at a temperature suitable to evaporate the solvent, such as between about 40° C. and 150° C., such as about 150° C., although the precise temperature depends upon the materials chosen for the second redistribution passivation layer 507. The pre-bake is performed for a time sufficient to cure and dry the second redistribution passivation layer 507, such as between about 10 seconds to about 5 minutes, such as about 270 seconds.

Once cured and dried, the second redistribution passivation layer 507 may be patterned in order to form openings 523, which are filled with conductive materials that form the second redistribution passivation layer 507, to first redistribution layer 505. In an embodiment the patterning may be initiated by placing the package for which the second redistribution passivation layer 507 has been formed over into an optical lithography system for exposure.

Figure 6:
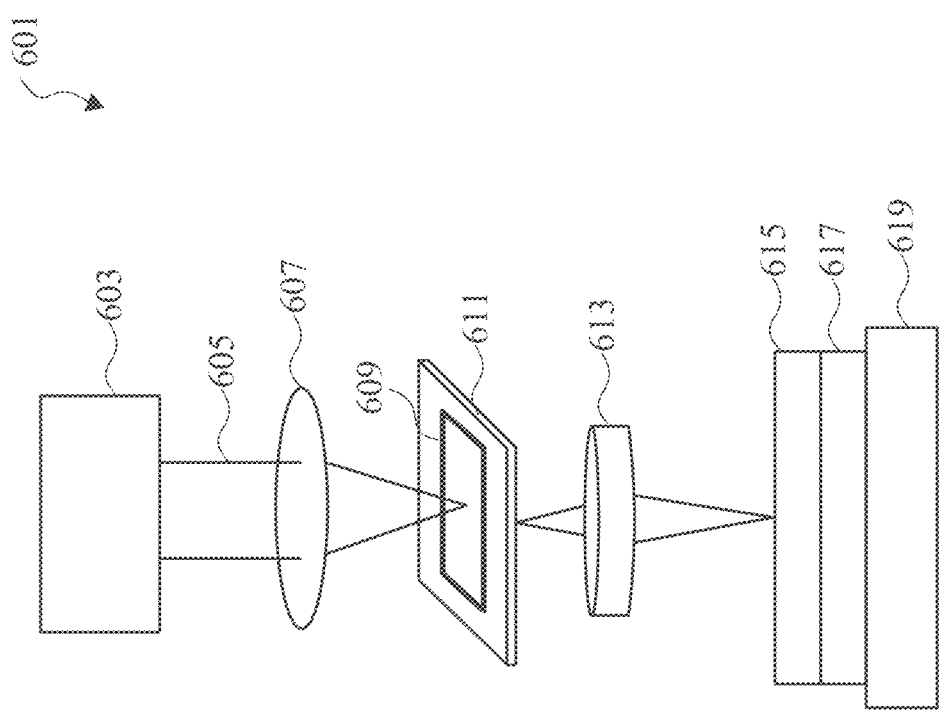
FIG. 6 illustrates an optical lithography system for use in forming a redistribution structure in accordance with some embodiments.

Referring to FIG. 6, an optical lithography system 601 is presented. The optical lithography system 601 may include a light source 603, a light 605, a condense lens 607, a photomask 609, a mask stage 611, a projection lens 613, a package stage 619, a package 617 (schematically representing the components, such as the carrier substrate 101, the first and second semiconductor devices 201 and 301, the encapsulant 401, etc. that the second redistribution passivation layer 507 is formed over, as illustrated in FIGS. 5A and 5B), and a passivation layer 615 referred to henceforth as the second redistribution passivation layer 507. However, other configurations and inclusion or omission of the system 601 may be possible.

The system 601 may also be referred as a stepper or a scanner, and the photo mask 609 is also referred to as a mask, a photo mask, or a reticle. The light source 603 includes a radiation source providing the light 605, having a UV wavelength of approximately 365 nm. For example, a mercury lamp may be utilized, which is operable to provide UV wavelengths such as an I-line (365 nm) wavelength. In an illustrative embodiment, the optical lithography system 601 is an I-line stepper that is operable to produce light having a single wavelength of 365 nm.

In an embodiment the light source 603 supplies the light 605 to the second redistribution passivation layer 507, in order to induce a reaction of the PACs, which in turn reacts with the second redistribution passivation layer polymer resin to chemically alter those portions of the second redistribution passivation layer 507 to which the light 605 impinges. The patterned light impinging upon portions of the second redistribution passivation layer 507 to induces a reaction of the PACs within the second redistribution passivation layer 507. The chemical reaction products of the PACs' absorption of the patterned light (e.g., acids/bases/free radicals) then reacts with the second redistribution passivation layer polymer resin, chemically altering the second redistribution passivation layer 507 in those portions that were illuminated through the patterned mask. The condense lens 607 is configured to guide the light 605 to the photomask 609. In an illustrative embodiment, only light in the I-line wavelength is supplied by the light 605 to the second redistribution passivation layer 507 during the exposure step (in contrast to broadband light from GHI-line wavelengths, for example).

In an embodiment the system 601 impinges the second redistribution passivation layer 507 with the light 605 with a low energy dose less than 500 mJ/cm$^2$. In some embodiments the energy dose is between about 60 to 185 mJ/cm$^2$. In other embodiments the energy dose is between about 125 to 375 mJ/cm$^2$. It will be appreciated that the amount of energy may depend on the thickness of the second redistribution passivation layer 507 and the size of the via opening being formed. For example, in an illustrative embodiment, the exposure dose may be 125 mJ/cm$^2$ (+/− approximately 60 mJ/cm$^2$) when the second redistribution passivation layer 507 is 7 um thick and the via opening is 7 um wide, whereas the exposure dose may be 250 mJ/cm$^2$ (+/− approximately 125 mJ/cm$^2$) when the second redistribution passivation layer 507 is 12.5 um thick and the via opening is 10 um wide.

The photomask 609 blocks a portion of the light 605 and provides an aerial image of the light 605 to form a patterned light. The photomask 609 may be a binary mask (BIM), a super binary mask (SBIM), or a phase shift mask (PSM), which includes an alternative phase shift mask (alt. PSM), or an attenuated phase shift mask (att. PSM). The photomask 609 is located between the energy source or the light 605 and the second redistribution passivation layer 507 in order to block portions of the light 605 to form a patterned energy prior to the light 605 actually impinging upon the second redistribution passivation layer 507. In an embodiment the photomask 609 may comprise a series of layers (e.g., substrate, absorbance layers, anti-reflective coating layers, shielding layers, etc.) to reflect, absorb, or otherwise block portions of the light 605 from reaching those portions of the second redistribution passivation layer 507, which are not desired to be illuminated. The desired pattern may be formed in the photomask 609 by forming openings through the photomask 609 in the desired shape of illumination.

The photomask 609 is positioned on the mask stage 611. The mask stage 611 includes a plurality of motors, roller guides, and tables. The mask stage 611 may secure the photomask 609 on the mask stage 611 by vacuum. The mask stage 611 is operable to provide accurate position and movement of the photomask 609 in X, Y, and Z directions during alignment, focus, leveling and exposure operation in the optical lithography system 601.

The projection lens 613 includes a magnification lens for reducing the pattern image provided by the photomask 609 and guides the patterned light to the second redistribution passivation layer 507, deposited on the substrate 617 that has been secured by the substrate stage 619. In an illustrative embodiment, the projection lens 613 has a low numerical aperture between about 0.1 and about 0.18, such as 0.16 (in contrast to a high numerical aperture in the range of 0.4 to 0.9).

The substrate stage 619 provides accurate position and movement of the substrate 617 in X, Y, and Z directions during alignment, focus, leveling and exposure operations in the optical lithography system 601 so that the image of the photomask 609 is transferred onto the second redistribution passivation layer 507, in a repetitive fashion (though other lithography methods are possible). The optical lithography system 601, or portions thereof, may include additional items, such as a vacuum system and/or a cooling system.

Again referencing FIGS. 5A and 5B, after the second redistribution passivation layer 507 has been exposed, a first post-exposure bake (PEB) may be used in order to assist in the generating, dispersing, and reacting of the acid/base/free radical generated from the impingement of the energy upon the PACs during the exposure. Such assistance helps to create or enhance chemical reactions which generate chemical differences and different polarities between those regions impinged by the energy and those regions that were not impinged by the energy. These chemical differences also cause differences in the solubility between the regions impinged by the energy and those regions that were not impinged by the energy. In an embodiment the temperature of the second redistribution passivation layer 507 may be increased to between about 70° C. and about 150° C. for a period of between about 40 seconds and about 120 seconds, such as about 2 minutes. In a particular, embodiments, the post-development bake may be performed at temperatures of 140° C., 150° C., 130° C., 110° C., 90° C. and 70° C., each for about 2 minutes.

Once the second redistribution passivation layer 507 has been exposed and baked, the second redistribution passivation layer 507 may be developed with the use of a developer. In an embodiment in which the second redistribution passivation layer 507 is the low-temperature cured polyimide, the first developer may be an organic solvent or critical fluid may be utilized to remove those portions of the second redistribution passivation layer 507 which were not exposed to the energy and, as such, retain their original solubility. Specific examples of materials that may be utilized include hydrocarbon solvents, alcohol solvents, ether solvents, ester solvents, critical fluids, combinations of these, or the like. Specific examples of materials that can be used for the negative tone solvent include cyclopentanon (A515), hexane, heptane, octane, toluene, xylene, dichloromethane, chloroform, carbon tetrachloride, trichloroethylene, methanol, ethanol, propanol, butanol, critical carbon dioxide, diethyl ether, dipropyl ether, dibutyl ether, ethyl vinyl ether, dioxane, propylene oxide, tetrahydrofuran, cellosolve, methyl cellosolve, butyl cellosolve, methyl carbitol, diethylene glycol monoethyl ether, acetone, methyl ethyl ketone, methyl isobutyl ketone, isophorone, cyclohexanone, methyl acetate, ethyl acetate, propyl acetate, butyl acetate, pyridine, formamide, N,N-dimethyl formamide, or the like.

The first developer may be applied to the second redistribution passivation layer 507 using, e.g., a spin-on process. In this process the first developer is applied to the second redistribution passivation layer 507 from above the second redistribution passivation layer 507 while the second redistribution passivation layer 507 is rotated. In an embodiment the first developer may be at a temperature of between about 10° C. and about 80° C., such as about 50° C., and the development may continue for between about 1 minute to about 60 minutes, such as about 30 minutes.

However, while the spin-on method described herein is one suitable method for developing the second redistribution passivation layer 507 after exposure, it is intended to be illustrative and is not intended to limit the embodiments. Rather, any suitable method for development, including dip processes, puddle processes, spray-on processes, combinations of these, or the like, may alternatively be used. All such development processes are fully intended to be included within the scope of the embodiments.

During the development stage, film loss occurs. However, film loss for low-temperature cure polyimides is reduced in I-line exposure over GHI-line exposure. For example, development film loss is decreased from 1.42 microns with GHI-line exposure to 0.47 microns with I-line exposure. GHI-line exposure is a broadband exposure using multiple wavelengths, whereas I-line exposure utilizes a single wavelength in the range of 365 nm.

After development a post development baking process may be utilized in order to help polymerize and stabilize the second redistribution passivation layer 507 after the development process. In an embodiment the post-exposure baking process may be performed at a temperature of about 140° C. for a time of about 2 minutes.

After the post-development baking and the RDL surface treatments, the second redistribution passivation layer 507 may be cured. In an embodiment in which the second redistribution passivation layer 507 comprises a low temperature cured polyimide, the curing process may be performed at a low temperature of less than about 230° C., such as a temperature of between about 200° C. and 230° C., such as about 220° C. for a time of between about 1 hour and about 2 hours. In particular embodiments the curing process may be performed at a temperature of about 230° C. for about 1 hour, a temperature of about 220° C. for a time of about 1 hour, or at a temperature of about 200° C. for a time of about 2 hours. However, any suitable temperature and time may be utilized.

Referring still to FIGS. 5A and 5B, after the second redistribution passivation layer 507 has been patterned, a second redistribution layer 509 may be formed to extend through the openings formed within the second redistribution passivation layer 507 and make electrical connection with the first redistribution layer 505. In an embodiment the second redistribution layer 509 may be formed using materials and processes similar to the first redistribution layer 505. For example, a seed layer may be applied and covered by a patterned photoresist, a conductive material such as copper may be applied onto the seed layer, the patterned photoresist may be removed, and the seed layer may be etched using the conductive material as a mask. However, any suitable material or process of manufacture may be used.

After the second redistribution layer 509 has been formed, a third redistribution passivation layer 511 is applied over the second redistribution layer 509 in order to help isolate and protect the second redistribution layer 509. In an embodiment the third redistribution passivation layer 511 may be formed of similar materials and in a similar fashion as the second redistribution passivation layer 507. For example, the third redistribution passivation layer 511 may be formed of a low-temperature cured polyimide that has been applied and patterned as will be described below. However, any suitable material or process of manufacture may be utilized.

After the third redistribution passivation layer 511 has been patterned, a third redistribution layer 513 may be formed to extend through the openings formed within the third redistribution passivation layer 511 and make electrical connection with the second redistribution layer 509. In an embodiment the third redistribution layer 513 may be formed using materials and processes similar to the first redistribution layer 505. For example, a seed layer may be applied and covered by a patterned photoresist, a conductive material such as copper may be applied onto the seed layer, the patterned photoresist may be removed, and the seed layer may be etched using the conductive material as a mask. However, any suitable material or process of manufacture may be used.

After the third redistribution layer 513 has been formed, a fourth redistribution passivation layer 515 may be formed over the third redistribution layer 513 in order to help isolate and protect the third redistribution layer 513. In an embodiment the fourth redistribution passivation layer 515 may be formed of similar materials and in a similar fashion as the second redistribution passivation layer 507. For example, the fourth redistribution passivation layer 515 may be formed of a low-temperature cured polyimide that has been applied and patterned as will be described below. However, any suitable material or process of manufacture may be utilized.

Other redistribution passivation layers formed of a low-temperature cure polyimide may be processed similarly as described above with respect to the second redistribution passivation layer 507.

Figure 7A:
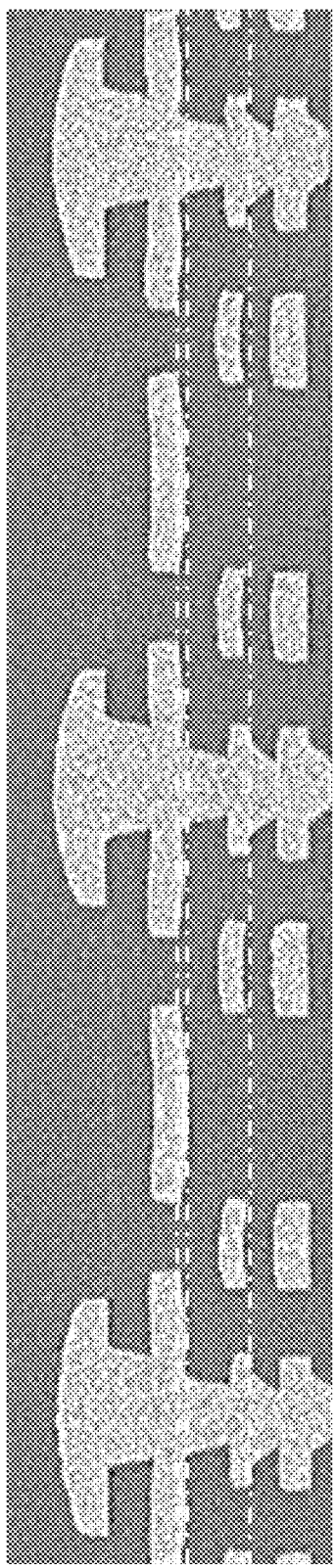
FIGS. 7A-7D illustrate a pictographic view of portions of a redistribution structure in accordance with some embodiments.
Figure 7B:
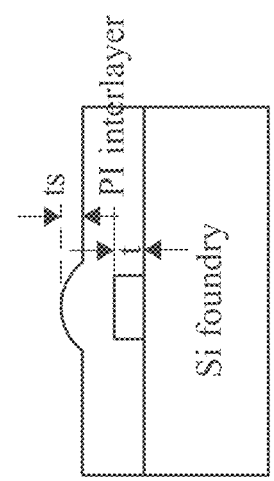

Referring to FIGS. 7A through 7D, portions of a redistribution structure, in accordance with some embodiments, is presented and help to illustrate the benefits of embodiments. FIG. 7A is a cross-sectional view of a redistribution structure formed as described herein. FIG. 7A illustrates the degree of planarization (DoP) for the redistribution structure. FIG. 7B illustrates a close up view of FIG. 7A, which illustrates imperfections in the surface of a redistribution passivation layer caused by an underlying redistribution layer. The DoP is determined by the following equation, where t is the thickness of the redistribution layer and ts is the height of the bump or imperfection in the redistribution passivation layer caused by the underlying redistribution layer:

$$DoP = \left(1 - \frac{ts}{t}\right) \times 100\%.$$

The DoP is improved when using an I-line exposure instead of a GHI-line exposure for redistribution passivation layers formed of low-temperature cure polyimides. For example, experimental data indicates that the DoP is improved from 48.6% to 71.4%. In other words, the surface of the low-temperature cure polyimide is significantly flatter after I-line exposure.

Figure 7C:
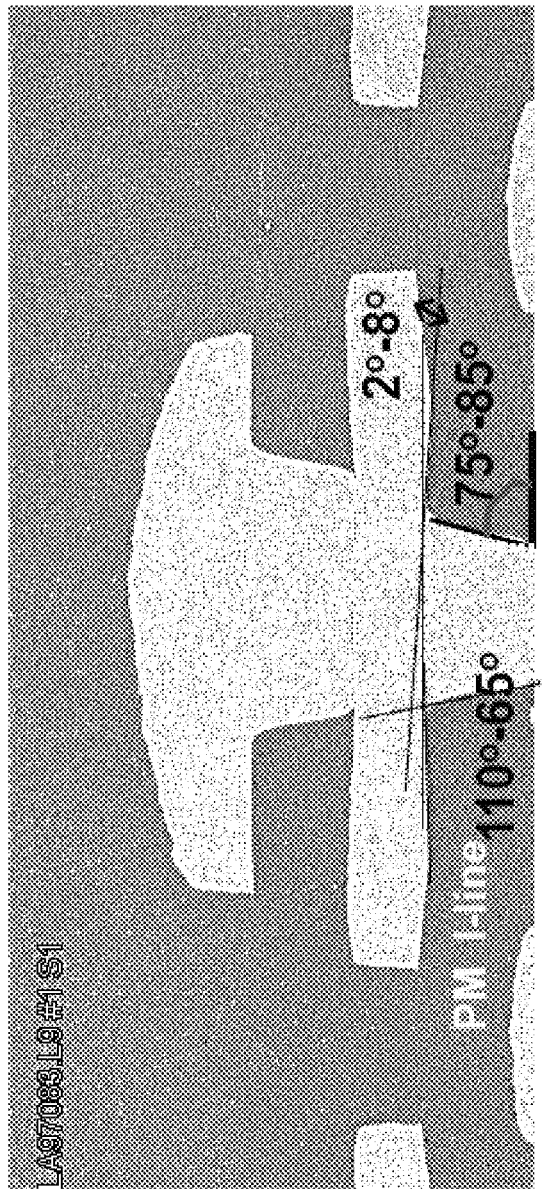
Figure 7D:
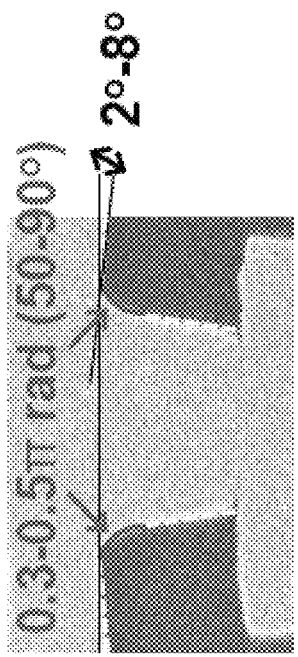

One factor that affects the DoP may be seen in more detail in FIGS. 7C and 7D. One of skill in the art will appreciate that during the previously described development stage, the cross-linking of the film, e.g., the low-temperature cure polyimide, is weakened and the weakening of the cross-linkage can affect the films performance during the cure process. It has been determined that low-temperature cure polyimides exposed to the single wavelength I-line have stronger cross-linking than low-temperature cure polyimides exposed to the broadband GHI-line. The result is that the top corners of the film that define the via openings are rounder when the low-temperature cure polyimide is exposed to the I-line. In some embodiments the top corners are rounded in the range of approximately 0.3 to 0.5 Π rad (50-90 degrees) as shown in FIG. 7D. The rounder via corners may reduce the low-temperature cure polyimide dielectric stress in, by way of a non-limiting example, an integrated fan out (InFO) package.

As discussed above, the patterning process affects rounding of the top corners of the passivation layer that define the via opening. However, the patterning process further creates indentions next to the via opening in the top surface of the passivation layer. The amount or angle of the indention from the via opening also affects the DoP. The greater the angle of indention, the wavier the top surface of the passivation layer is, resulting in a lower DoP because of increases in the is value. In an illustrative embodiment low-temperature cure polyimides exposed to the I-line have an angle of indention of approximately 2 to 8 degrees, whereas those exposed to the GHI-line have an angle of indention of approximately 10 to 15 degrees.

Referring primarily to FIG. 7C, the angle of the sidewall of the via can be seen. I-line exposure produces steeper via profiles than GHI-line with low-temperature cure polyimides, which can significantly enlarge a redistribution line (RDL) routing window. By way of example, the via profile for an I-line is 75-85 degrees, whereas the via profile for the GHI-line is only 55-65 degrees.

Figure 8A:
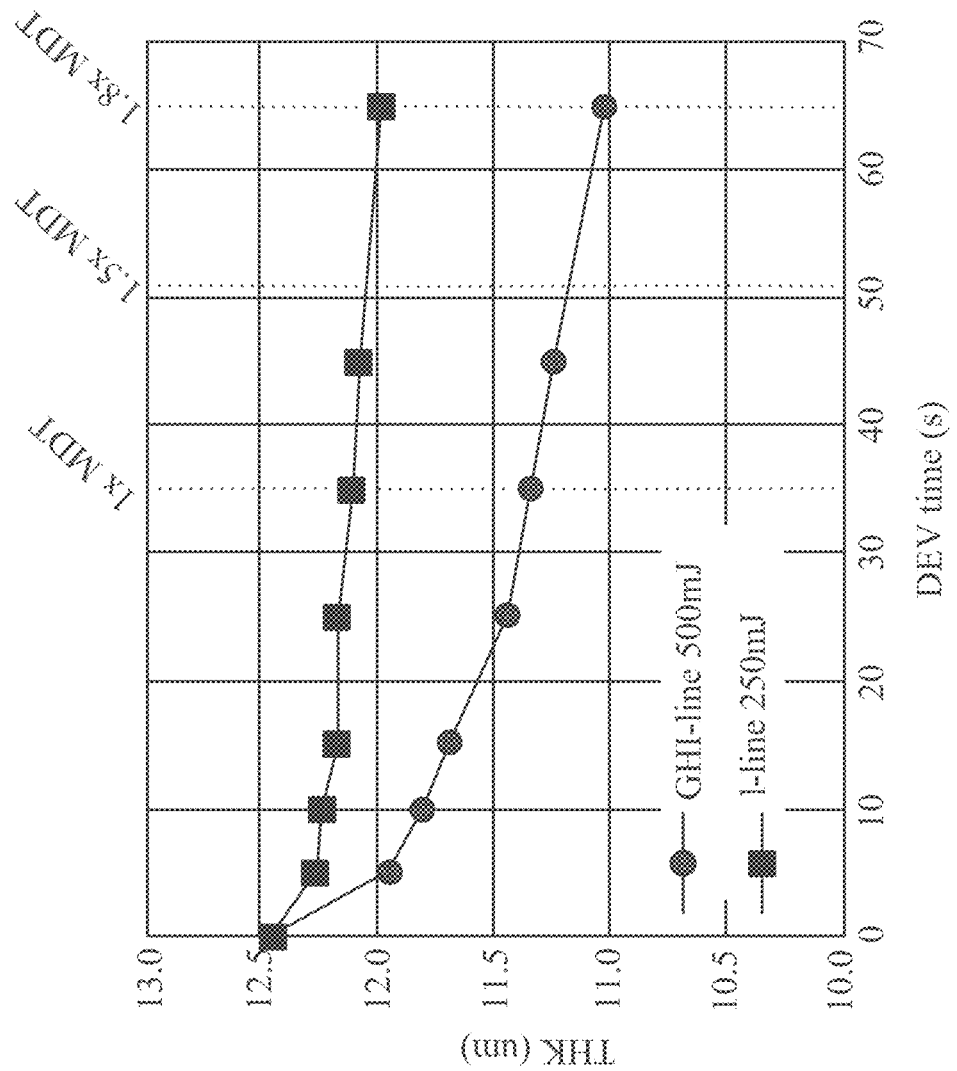
FIG. 8A illustrates a graphical representation of the mean target thickness (THK) of a via relative to development time in accordance with some embodiments.

FIG. 8A illustrates a graphical representation of the mean target thickness (THK) of a via relative to development time in accordance with some embodiments, where the passivation layer the via is formed in is a low-temperature cure polyimide. FIG. 8A compares the THK of the via versus the development time for a low-temperature cure polyimide exposed to a GHI-line and to an I-line. The THK for the passivation layer exposed to the I-line at 1.8 times the minimum development time (MDT) shows a loss of 0.47 microns. In comparison, the THK for the passivation layer exposed to the GHI-line at 1.8 times the MDT is 1.42 microns.

Figure 8B:
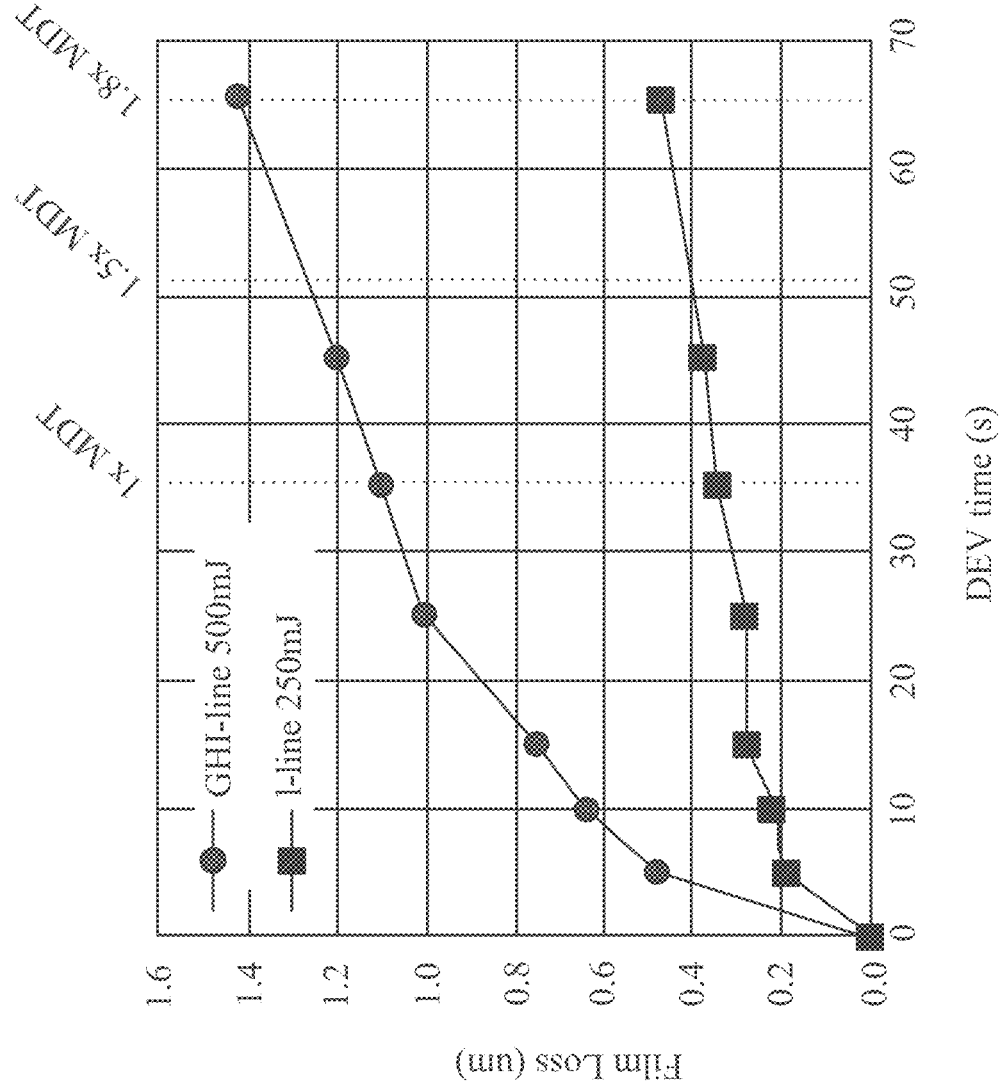
FIG. 8B illustrates a graphical representation of film loss of a passivation layer relative to development time in accordance with some embodiments.

FIG. 8B illustrates a graphical representation of film loss of a passivation layer formed of a low-temperature cure polyimide relative to development time in accordance with some embodiments, where the passivation layer the via is formed in is a low-temperature cure polyimide. FIG. 8B compares the amount of film loss versus the development time for a low-temperature cure polyimide exposed to a GHI-line and to an I-line. The film loss for the passivation layer exposed to the I-line at 1.8 times the minimum development time (MDT) shows a loss of 0.47 microns. In comparison, the film loss for the passivation layer exposed to the GHI-line at 1.8 times the MDT is 1.42 microns.

Figure 9A:
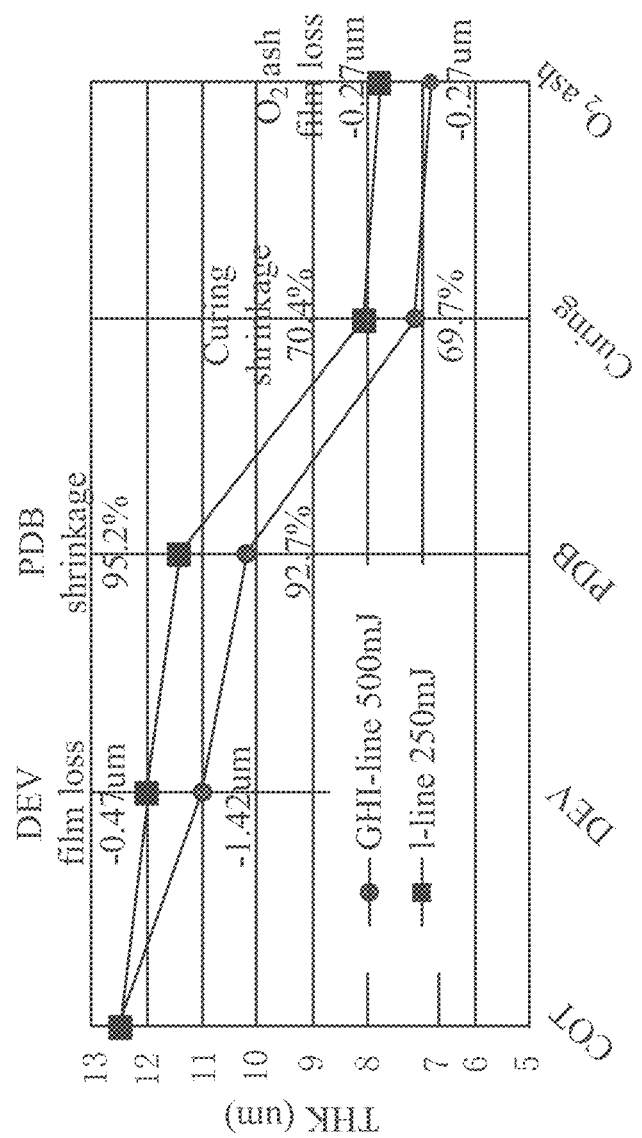
FIGS. 9A-9B illustrate experimental data comparing the mean target thickness (THK) for passivation layers exposed to GHI-line versus I-line wavelengths during various steps in a patterning process in accordance with some embodiments.
Figure 9B:
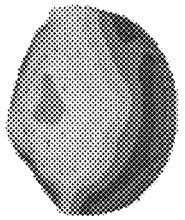

FIGS. 9A-9B illustrate experimental data comparing the mean target thickness (THK) for passivation layers exposed to GHI-line versus I-line wavelengths during various steps in a patterning process in accordance with some embodiments.

Resolution is better for an I-line exposure over a GHI-line exposure with low-temperature cure polyimides. For example, the exposure via aspect ratio limitation is improved from 1.1 to 1.3. Film loss and shrinkage rate is reduced in I-line exposure over GHI-line with low-temperature cure polyimides. For example, development film loss is decreased from 1.42 microns to 0.47 microns and post development baking (PDB) shrinkage is improved from 92.7% to 95.2%. Consequently, the AEI THK is increased by 0.9 microns (7.75–6.85 microns). Likewise, the final AEI via aspect ratio limitation is improved from 0.62 (6.85/11.02 microns) to 0.8 (7.75/9.64 microns). For example, the maximum via critical dimension (CD) aspect ratio (THK/CD) is 0.6 with GHI-line exposure, wherein the THK is 6.85 microns and the CD is 11.02 microns. In contrast, the maximum via critical dimension (CD) aspect ratio (THK/CD) is 0.8 with I-line exposure, wherein the THK is 7.75 microns and the CD is 9.64 microns.

Using I-line exposure with a low-temperature cure polyimide allows for a high resolution via opening with an aspect ratio AR=1:1, a small via opening (e.g., less than 15 microns), and a high thickness (e.g., greater than 7 microns). By way of example, a low-temperature cure polyimide with a bottom CD of 10 microns exposed to GHI-line has a THK of 5 microns, a via angle of 55-65 degrees and a top CD of 12.66 to approximately 17.66 microns. In contrast, a low-temperature cure polyimide with a bottom CD of 10 microns exposed to I-line has a THK of 7 microns, a via angle of 75-85 degrees and a top CD of 11.22 to approximately 13.74 microns.

Figure 10:
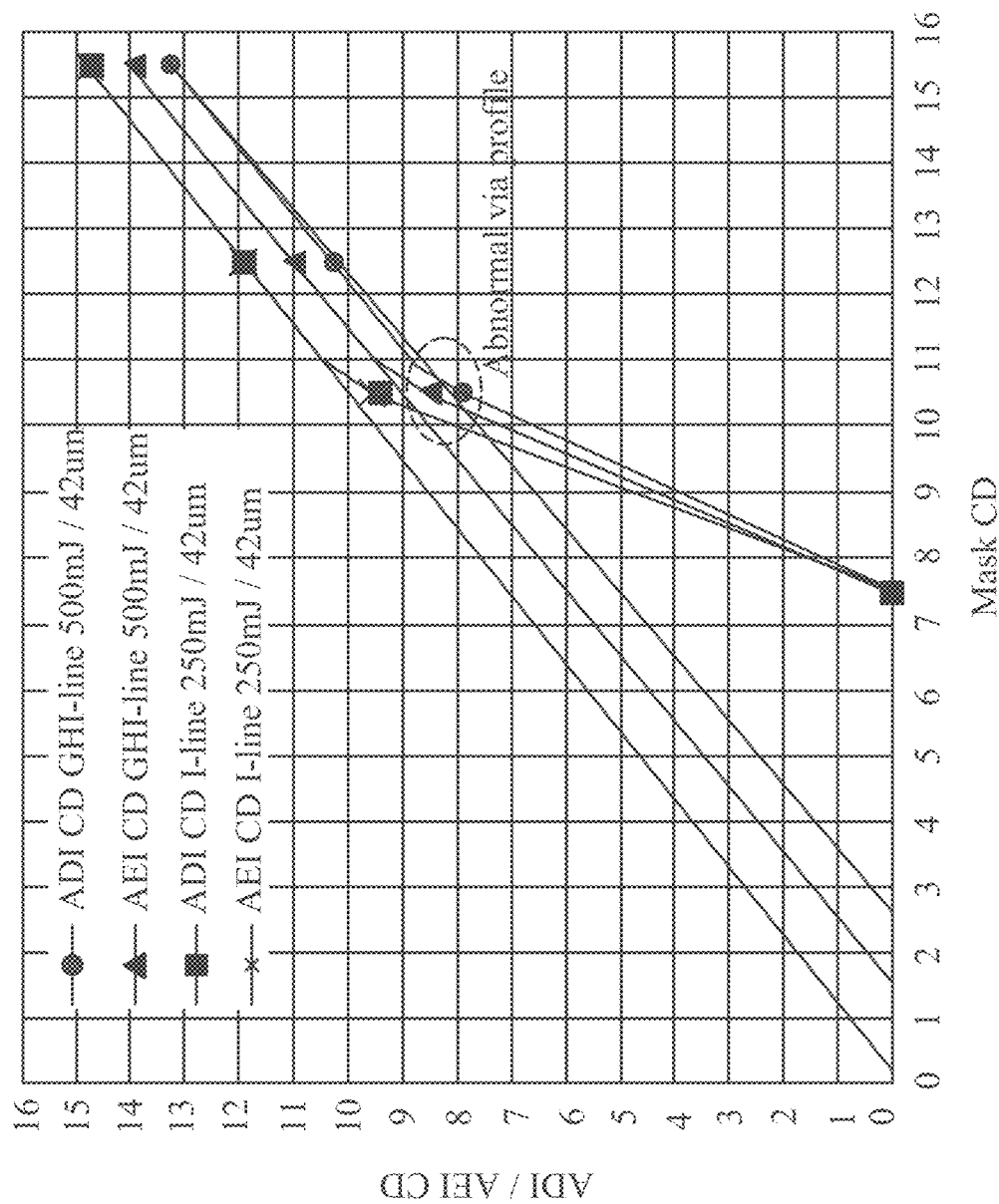
FIG. 10 illustrates experimental data comparing the after etch inspection and after development inspection critical dimensions versus mask critical dimensions for passivation layers exposed to GHI-line versus I-line wavelengths during a patterning process in accordance with some embodiments.

Referring to FIG. 10, a graph is presented that illustrates experimental data comparing the after etch inspection (AEI) and after development inspection (ADI) critical dimension (CD) versus mask critical dimension (CD) for passivation layers exposed to GHI-line versus I-line wavelengths during a patterning process in accordance with some embodiments. It will be appreciated to one of skill in the art that different energy application of the GHI-line is needed than for the I-line to achieve comparable results. It is shown that for small via openings, e.g., via openings less than 15 microns, in low-temperature cure polyimides result in an abnormal via profile when exposed to a GHI-line. As illustrated in FIG. 10, the ADI CD profile for the GHI-line diverges from the AEI CD profile for the GHI-line. In contrast, under the same circumstances, the low-temperature cure polyimide exposed to just an I-line does not have an abnormal via profile; e.g., the ADI CD profile for the I-line tracks the AEI CD profile for the I-line. I-line exposure can solve or mitigate abnormal low-temperature cure polyimide via profile issues that occur with GHI-line exposure in small via openings (less than 15 microns) with AEI THK greater than 7 microns. It will be appreciated that abnormal via profiles result in discontinuous seed layer deposition within the via opening. This can cause cracks and voids within the conductive material that fills the via opening and can further cause the top layer of the conductive material to dip in the middle.

Another benefit of utilizing I-line exposure for low-temperature cure polyimides is that the I-line depth-of-focus (DoF) can be enlarged over the DoF for a GHI-line. For example, with a 10 micron via opening and an AEI THK greater than 7 microns, the DoF for an I-line is 16 microns, whereas the DoF for a GHI-line is 4 microns. Additionally, the target AEI THK can be increased to 7 microns for an I-line exposure from 5 microns for a GHI-line exposure.

As yet another benefit, I-line exposure to low-temperature cure polyimides can mitigate the footing effect that occurs at the base of an opening or via relative to GHI-line exposure because the single wavelength of the I-line reduces light scattering. Consequently, I-line exposure can reduce mask critical dimension (CD) because of the mitigated footing effect.

Referring again to FIGS. 5A-5B, these figures further illustrate a formation of underbump metallizations 519 and third external connectors 517 to make electrical contact with the third redistribution layer 513. In an embodiment the underbump metallizations 519 may each comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the underbump metallizations 519. Any suitable materials or layers of material that may be used for the underbump metallizations 519 are fully intended to be included within the scope of the embodiments.

In an embodiment the underbump metallizations 519 are created by forming each layer over the third redistribution layer 513 and along the interior of the openings through the fourth redistribution passivation layer 515. The forming of each layer may be performed using a plating process, such as electrochemical plating, although other processes of formation, such as sputtering, evaporation, or PECVD process, may be used depending upon the desired materials. The underbump metallizations 519 may be formed to have a thickness of between about 0.7 µm and about 10 µm, such as about 5 µm.

In an embodiment the third external connectors 517 may be placed on the underbump metallizations 519 and may be a ball grid array (BGA) which comprises a eutectic material such as solder, although any suitable materials may alternatively be used. In an embodiment in which the third external connectors 517 are solder balls, the third external connectors 517 may be formed using a ball drop method, such as a direct ball drop process. Alternatively, the solder balls may be formed by initially forming a layer of tin through any suitable method such as evaporation, electroplating, printing, solder transfer, and then performing a reflow in order to shape the material into the desired bump shape. Once the third external connectors 517 have been formed, a test may be performed to ensure that the structure is suitable for further processing.

Figure 11:
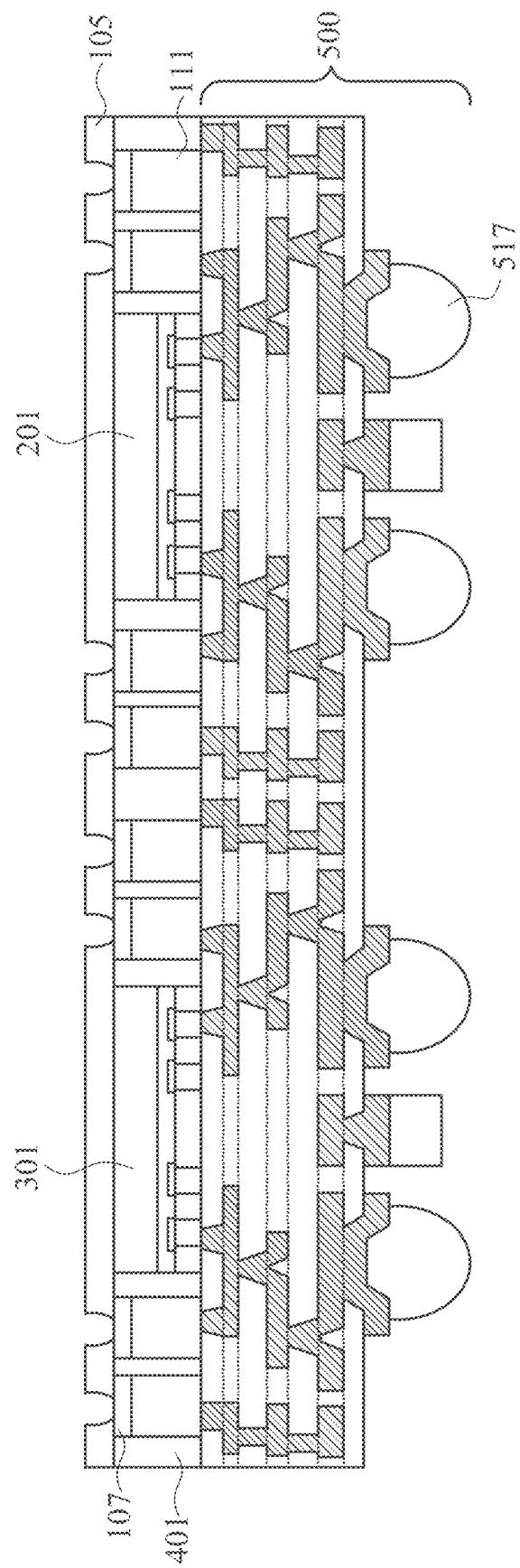
FIG. 11 illustrates an exposure of the vias in accordance with some embodiments.

Referring now to FIG. 11, the first semiconductor device 201 and the second semiconductor device 301 are illustrated after they have been debonded from the first carrier substrate 101. It should be noted, however, that before debonding, the third external connectors 517 and, hence, the structure including the first semiconductor device 201 and the second semiconductor device 301, may be attached to a ring structure (not separately illustrated in FIG. 11). The ring structure may be a metal ring intended to provide support and stability for the structure during and after the debonding process. In an embodiment the third external connectors 517, the first semiconductor device 201, and the second semiconductor device 301 are attached to the ring structure using, e.g., an ultraviolet tape (also not illustrated in FIG. 11), although any other suitable adhesive or attachment may alternatively be used.

Once the third external connectors 517 and, hence, the structure including the first semiconductor device 201 and the second semiconductor device 301 are attached to the ring structure, the first carrier substrate 101 may be debonded from the structure including the first semiconductor device 201 and the second semiconductor device 301 using, e.g., a thermal process to alter the adhesive properties of the adhesive layer 103. In a particular embodiment an energy source such as an ultraviolet (UV) laser, a carbon dioxide ($CO_2$) laser, or an infrared (IR) laser, is utilized to irradiate and heat the adhesive layer 103 until the adhesive layer 103 loses at least some of its adhesive properties. Once performed, the first carrier substrate 101 and the adhesive layer 103 may be physically separated and removed from the structure comprising the third external connectors 517, the first semiconductor device 201, and the second semiconductor device 301.

However, while a ring structure may be used to support the third external connectors 517, such as description is merely one method that may be used and is not intended to be limiting upon the embodiments. In another embodiment the third external connectors 517 may be attached to a second carrier substrate using, e.g., a first glue. In an embodiment the second carrier substrate is similar to the first carrier substrate 101, although it may also be different. Once attached, the adhesive layer 103 may be irradiated and the adhesive layer 103 and the first carrier substrate 101 may be physically removed.

Still referring to FIG. 11, a patterning of the polymer layer 105 in order to expose the vias 111 (along with the associated first seed layer 107) is illustrated. In an embodiment the polymer layer 105 may be patterned using, e.g., a laser drilling method. In such a method a protective layer, such as a light-to-heat conversion (LTHC) layer or a hogomax layer (not separately illustrated in FIG. 11) is first deposited over the polymer layer 105. Once protected, a laser is directed towards those portions of the polymer layer 105 which are desired to be removed in order to expose the underlying vias 111. During the laser drilling process the drill energy may be in a range from 0.1 mJ to about 30 mJ, and a drill angle of about 0 degree (perpendicular to the polymer layer 105) to about 85 degrees to normal of the polymer layer 105. In an embodiment the patterning may be formed to form openings over the vias 111 to have a width of between about 100 µm and about 300 µm, such as about 200 µm.

In another embodiment, the polymer layer 105 may be patterned by initially applying a photoresist (not individually illustrated in FIG. 11) to the polymer layer 105 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the polymer layer 105 are removed with, e.g., a dry etch process. However, any other suitable method for patterning the polymer layer 105 may be utilized.

In operation, the third external connectors 517 may be debonded from the ring structure by initially bonding the first package 700 to a second ring structure using, e.g., a second ultraviolet tape. Once bonded, the ultraviolet tape may be irradiated with ultraviolet radiation and, once the ultraviolet tape has lost its adhesiveness, the third external connectors 517 may be physically separated from the ring structure.

A singulation may be performed on the structure to form the first InFO-POP structure. In an embodiment the singulation may be performed by using a laser or a saw blade (not shown) to slice through the encapsulant 401 and the polymer layer 105 between the vias 111, thereby separating one section from another to form the first InFO-POP structure with the second semiconductor device 301. However, as one of ordinary skill in the art will recognize, utilizing a saw blade to singulate the first InFO-POP structure is merely one illustrative embodiment and is not intended to be limiting. Alternative methods for singulating the first InFO-POP structure, such as utilizing one or more etches to separate the first InFO-POP structure, may alternatively be utilized. These methods and any other suitable methods may alternatively be utilized to singulate the first InFO-POP structure.

Figure 12:
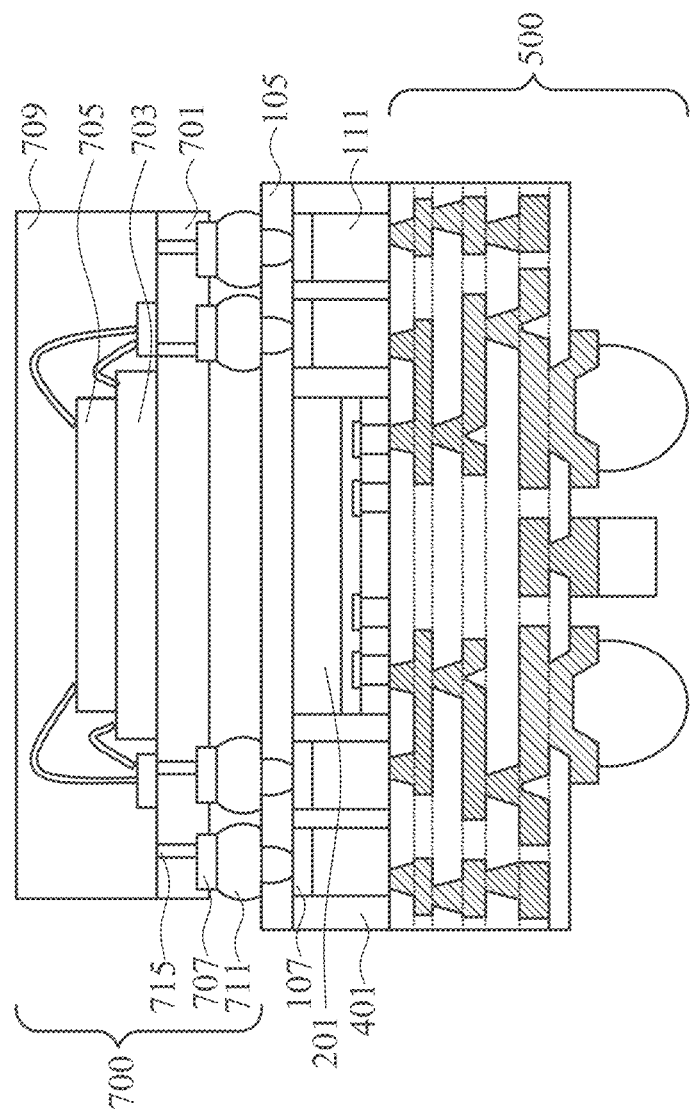
FIG. 12 illustrates a bonding of a package in accordance with some embodiments.

FIG. 12 illustrates a bonding of a first package 700. In an embodiment the first package 700 may comprise a third substrate 701, a third semiconductor device 703, a fourth semiconductor device 705 (bonded to the third semiconductor device 703), third contact pads 707, a second encapsulant 709, and fourth external connections 711. In an embodiment the third substrate 701 may be, e.g., a packaging substrate comprising internal interconnects (e.g., through substrate vias 715) to connect the third semiconductor device 703 and the fourth semiconductor device 705 to the vias 111.

Alternatively, the third substrate 701 may be an interposer used as an intermediate substrate to connect the third semiconductor device 703 and the fourth semiconductor device 705 to the vias 111. In this embodiment the third substrate 701 may be, e.g., a silicon substrate, doped or undoped, or an active layer of a silicon-on-insulator (SOI) substrate. However, the third substrate 701 may also be a glass substrate, a ceramic substrate, a polymer substrate, or any other substrate that may provide a suitable protection and/or interconnection functionality. These and any other suitable materials may be used for the third substrate 701.

The third semiconductor device 703 may be a semiconductor device designed for an intended purpose such as being a logic die, a central processing unit (CPU) die, a memory die (e.g., a DRAM die), combinations of these, or the like. In an embodiment the third semiconductor device 703 comprises integrated circuit devices, such as transistors, capacitors, inductors, resistors, first metallization layers (not shown), and the like, therein, as desired for a particular functionality. In an embodiment the third semiconductor device 703 is designed and manufactured to work in conjunction with or concurrently with the first semiconductor device 201.

The fourth semiconductor device 705 may be similar to the third semiconductor device 703. For example, the fourth semiconductor device 705 may be a semiconductor device designed for an intended purpose (e.g., a DRAM die) and comprising integrated circuit devices for a desired functionality. In an embodiment the fourth semiconductor device 705 is designed to work in conjunction with or concurrently with the first semiconductor device 201 and/or the third semiconductor device 703.

The fourth semiconductor device 705 may be bonded to the third semiconductor device 703. In an embodiment the fourth semiconductor device 705 is only physically bonded with the third semiconductor device 703, such as by using an adhesive. In this embodiment the fourth semiconductor device 705 and the third semiconductor device 703 may be electrically connected to the third substrate 701 using, e.g., wire bonds, although any suitable electrical bonding may be alternatively be utilized.

Alternatively, the fourth semiconductor device 705 may be bonded to the third semiconductor device 703 both physically and electrically. In this embodiment the fourth semiconductor device 705 may comprise fourth external connections (not separately illustrated in FIG. 12) that connect with fifth external connection (also not separately illustrated in FIG. 12) on the third semiconductor device 703 in order to interconnect the fourth semiconductor device 705 with the third semiconductor device 703.

The third contact pads 707 may be formed on the third substrate 701 to form electrical connections between the third semiconductor device 703 and, e.g., the fourth external connections 711. In an embodiment the third contact pads 707 may be formed over and in electrical contact with electrical routing (such as through substrate vias 715) within the third substrate 701. The third contact pads 707 may comprise aluminum, but other materials, such as copper, may alternatively be used. The third contact pads 707 may be formed using a deposition process, such as sputtering, to form a layer of material (not shown) and portions of the layer of material may then be removed through a suitable process (such as photolithographic masking and etching) to form the third contact pads 707. However, any other suitable process may be utilized to form the third contact pads 707. The third contact pads 707 may be formed to have a thickness of between about 0.5 µm and about 4 µm, such as about 1.45 µm.

The second encapsulant 709 may be used to encapsulate and protect the third semiconductor device 703, the fourth semiconductor device 705, and the third substrate 701. In an embodiment the second encapsulant 709 may be a molding compound and may be placed using a molding device (not illustrated in FIG. 12). For example, the third substrate 701, the third semiconductor device 703, and the fourth semiconductor device 705 may be placed within a cavity of the molding device, and the cavity may be hermetically sealed. The second encapsulant 709 may be placed within the cavity either before the cavity is hermetically sealed or else may be injected into the cavity through an injection port. In an embodiment the second encapsulant 709 may be a molding compound resin such as polyimide, PPS, PEEK, PES, a heat resistant crystal resin, combinations of these, or the like.

Once the second encapsulant 709 has been placed into the cavity such that the second encapsulant 709 encapsulates the region around the third substrate 701, the third semiconductor device 703, and the fourth semiconductor device 705, the second encapsulant 709 may be cured in order to harden the second encapsulant 709 for optimum protection. While the exact curing process is dependent at least in part on the particular material chosen for the second encapsulant 709, in an embodiment in which molding compound is chosen as the second encapsulant 709, the curing could occur through a process such as heating the second encapsulant 709 to between about 100° C. and about 130° C., such as about 125° C. for about 60 sec to about 3000 sec, such as about 600 sec. Additionally, initiators and/or catalysts may be included within the second encapsulant 709 to better control the curing process.

However, as one having ordinary skill in the art will recognize, the curing process described above is merely an exemplary process and is not meant to limit the current embodiments. Other curing processes, such as irradiation or even allowing the second encapsulant 709 to harden at ambient temperature, may alternatively be used. Any suitable curing process may be used, and all such processes are fully intended to be included within the scope of the embodiments discussed herein.

In an embodiment the fourth external connections 711 may be formed to provide an external connection between the third substrate 701 and, e.g., the vias 111. The fourth external connections 711 may be contact bumps such as microbumps or controlled collapse chip connection (C4) bumps and may comprise a material such as tin, or other suitable materials, such as silver or copper. In an embodiment in which the fourth external connections 711 are tin solder bumps, the fourth external connections 711 may be formed by initially forming a layer of tin through any suitable method such as evaporation, electroplating, printing, solder transfer, ball placement, etc., to a thickness of, e.g., about 100 μm. Once a layer of tin has been formed on the structure, a reflow is performed in order to shape the material into the desired bump shape.

Once the fourth external connections 711 have been formed, the fourth external connections 711 are aligned with and placed over the vias 111, and a bonding is performed. For example, in an embodiment in which the fourth external connections 711 are solder bumps, the bonding process may comprise a reflow process whereby the temperature of the fourth external connections 711 is raised to a point where the fourth external connections 711 will liquefy and flow, thereby bonding the first package 700 to the vias 111 once the fourth external connections 711 resolidifies.

In an embodiment, a method of manufacturing a semiconductor device includes the step of positioning a patterned mask over a dielectric layer. The dielectric layer comprises a low-temperature cure polyimide. The method further includes the steps of exposing a first surface of the dielectric layer through the patterned mask to an I-line wavelength within an I-line stepper, and developing the dielectric layer to form an opening.

In another embodiment, a method of manufacturing a semiconductor device includes the steps of forming a dielectric layer over a seed layer, positioning a patterned mask over the dielectric layer, wherein the dielectric layer comprising a low-temperature cure polyimide. The method further includes the steps of exposing a first surface of the dielectric layer to light of an I-line stepper, developing the dielectric layer to form an opening extending to a top surface of the seed layer and forming contact vias in the opening.

In yet another embodiment, a semiconductor device includes a first redistribution layer and a first redistribution passivation layer over the first redistribution layer. The first redistribution passivation layer includes a top surface and an opposing bottom surface with the top surface having indentions formed therein. The angle of the indentions is between about 2 degrees and about 8 degrees. The first redistribution passivation layer further includes an opening that exposes a portion of the first redistribution layer. Top corners of the opening are rounded in the range of approximately 0.3 to 0.5 Π rad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein.

Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first via over a first carrier;
   attaching a first semiconductor device over the first carrier adjacent the first via;
   forming a first encapsulant surrounding the first via and the first semiconductor device;
   planarizing the first via, the first semiconductor device, and the first encapsulant;
   forming a first redistribution passivation layer over the first semiconductor device and the first via;
   forming a second via extending through the first redistribution passivation layer to contact the first semiconductor device;
   forming a third via extending through the first redistribution passivation layer to contact the first via;
   planarizing the second via, the third via, and the first redistribution passivation layer;
   after planarizing the second via, the third via, and the first redistribution passivation layer, forming a first redistribution layer over and in contact with the second via, the third via, and the first redistribution passivation layer;
   forming a second redistribution passivation layer over the first redistribution passivation layer and the first redistribution layer, the second redistribution passivation layer comprising a polymer made up of monomers of the following formula:

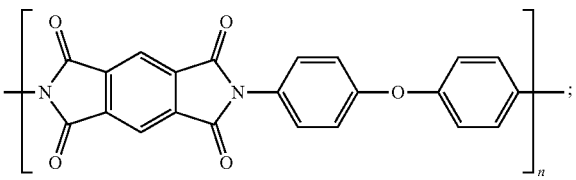

exposing the second redistribution passivation layer to patterned I-line light;
   developing the second redistribution passivation layer to form an opening exposing the first redistribution layer; and
   forming a second redistribution layer in the opening, the second redistribution layer comprising a single continuous seed layer extending along an uppermost surface of the second redistribution passivation layer and contacting the first redistribution layer, wherein the second redistribution passivation layer comprises a single continuous layer surrounding and contacting sidewalls of the first redistribution layer and the second redistribution layer, and wherein a bottommost surface of the second redistribution passivation layer is level with a bottommost surface of the first redistribution layer.

2. The method of claim 1, wherein the first redistribution passivation layer comprises PBO.

3. The method of claim 2, wherein the second redistribution passivation layer comprises a low-temperature cured polyimide.

4. The method of claim 3, wherein the first redistribution passivation layer is a positive tone material, and wherein the second redistribution passivation layer is a negative tone material.

5. The method of claim 1, wherein the forming the second redistribution layer comprises curing the second redistribution layer at a temperature of less than 230° C.

6. The method of claim 1, wherein the forming the second redistribution layer comprises baking the second redistribution passivation layer before the exposing the second redistribution passivation layer, wherein the baking is performed at a temperature of between 40° C. and 150° C., and wherein the baking drives off a solvent.

7. The method of claim 1, wherein the forming the second redistribution layer comprises a post-exposure bake, wherein the post-exposure bake is performed after the exposing the second redistribution passivation layer and before the developing the second redistribution passivation layer, and wherein the post-exposure bake is performed at between 70° C. and 150° C.

8. A method comprising:
depositing a first polymer layer over a first carrier substrate;
forming a first via over the first polymer layer;
attaching a semiconductor device to the first polymer layer adjacent the first via;
forming a first dielectric layer over the semiconductor device and the first via, the first dielectric layer comprising polybenzoxazole (PBO), wherein the PBO is a positive tone material;
forming a first conductive redistribution layer extending through the first dielectric layer;
forming a second dielectric layer over the first dielectric layer and the first conductive redistribution layer, the second dielectric layer comprising polymer made up of monomers of the following formula:

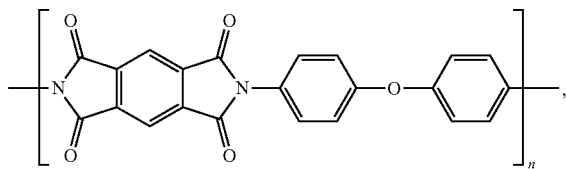

the second dielectric layer having a constant composition throughout, wherein forming the second dielectric layer comprises:
depositing the second dielectric layer over the first dielectric layer;
curing the second dielectric layer at a temperature from 40° C. to 150° C. to remove at least one solvent component from the second dielectric layer;
exposing the second dielectric layer to a patterned light of an I-line wavelength;
after exposing the second dielectric layer to a patterned light, performing a post-exposure baking process at a temperature from 70° C. to 150° C. on the second dielectric layer;
developing the second dielectric layer to form an opening extending to a top surface of the first conductive redistribution layer, wherein after the opening is formed, a top surface of the second dielectric layer comprises indentions adjacent the opening, wherein an angle of the indentions is between 2 degrees and 8 degrees; and
after developing the second dielectric layer to form the opening, performing a post-development baking process on the second dielectric layer;
after performing the post-development baking process on the second dielectric layer, curing the second dielectric layer at a temperature from 200° C. to 230° C.;
forming a via in the opening, the via contacting the first conductive redistribution layer and extending over the second dielectric layer, wherein top corners of the second dielectric layer adjacent the via are rounded in a range of 0.3 to 0.5 Π rad;
removing the first carrier substrate from the first polymer layer;
etching the first polymer layer to form a first opening exposing the first via; and forming a solder bump in the first opening and in contact with the first via.

9. The method of claim 8, wherein sidewalls of the via have an angle of between 75 and 85 degrees.

10. The method of claim 8, wherein the second dielectric layer comprises a negative tone, low-temperature cured polyimide.

11. The method of claim 9, wherein when the second dielectric layer is deposited, the second dielectric layer comprises between 5% and 50% of the low-temperature cured polyimide and between 0.1% and 20% photoactive components (PACs).

12. The method of claim 8, wherein the second dielectric layer is exposed to the I-line wavelength at between 60 and 185 mJ/cm$^2$.

13. The method of claim 8, wherein the second dielectric layer has a thickness of between 7 and 35 μm.

14. A method comprising:
forming a first redistribution via in a first redistribution passivation layer;
planarizing the first redistribution via and the first redistribution passivation layer;
after planarizing the first redistribution via and the first redistribution passivation layer, forming a first redistribution layer over the first redistribution via and the first redistribution passivation layer;
after forming the first redistribution layer, forming a second redistribution passivation layer over the first redistribution layer and the first redistribution passivation layer, the second redistribution passivation layer comprising a topmost surface and an opposing bottommost surface, the topmost surface having indentions formed therein, wherein an angle of the indentions is between about 2 degrees and about 8 degrees, wherein the bottommost surface of the second redistribution passivation layer is level with a topmost surface of the first redistribution via, and wherein the second redistribution passivation layer comprises a polymer made up of monomers of the following formula:

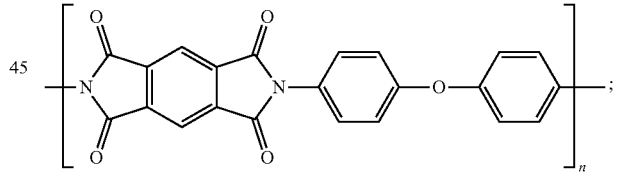

forming a second redistribution layer extending through the second redistribution passivation layer, wherein the second redistribution layer is coupled to the first redistribution via, and wherein top corners of the second redistribution passivation layer adjacent the second redistribution layer are rounded in a range of approximately 0.3 to 0.5 Π rad, and wherein the second redistribution layer comprises a single continuous seed layer in physical contact with the first redistribution layer, sidewalls of the second redistribution passivation layer, and the topmost surface of the second redistribution passivation layer; and
forming a third redistribution passivation layer over the second redistribution passivation layer and the second redistribution layer.

15. The method of claim 14, further comprising forming an opening in the second redistribution passivation layer having sidewalls with angles greater than 75 degrees, wherein forming the second redistribution layer comprises filling the opening.

16. The method of claim 15, wherein the angles of the sidewalls are less than 85 degrees.

17. The method of claim 14, further comprising forming an opening in the second redistribution passivation layer, the opening having a width less than or equal to 15 microns, wherein forming the second redistribution layer comprises filling the opening.

18. The method of claim 14, further comprising forming an opening in the second redistribution passivation layer, the opening having a mean target thickness of 7 microns, wherein forming the second redistribution layer comprises filling the opening.

19. The method of claim 14, wherein the second redistribution passivation layer comprises a low-temperature cured polyimide.

20. The method of claim 14, wherein the first redistribution passivation layer comprises polybenzoxazole (PBO).

* * * * *